United States Patent
Ootsuka et al.

(10) Patent No.: US 10,088,608 B2
(45) Date of Patent: Oct. 2, 2018

(54) LENS ARRAY AND MANUFACTURING METHOD THEREFOR, SOLID-STATE IMAGING APPARATUS, AND ELECTRONIC APPARATUS

(71) Applicant: SONY CORPORATION, Tokyo (JP)

(72) Inventors: Yoichi Ootsuka, Kumamoto (JP); Kenju Nishikido, Kumamoto (JP); Ippei Yoshiba, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 7 days.

(21) Appl. No.: 15/021,764

(22) PCT Filed: Sep. 12, 2014

(86) PCT No.: PCT/JP2014/074244
§ 371 (c)(1),
(2) Date: Mar. 14, 2016

(87) PCT Pub. No.: WO2015/045914
PCT Pub. Date: Apr. 2, 2015

(65) Prior Publication Data
US 2016/0231468 A1    Aug. 11, 2016

(30) Foreign Application Priority Data
Sep. 25, 2013 (JP) ................. 2013-197861

(51) Int. Cl.
*G02B 3/08* (2006.01)
*G02B 3/00* (2006.01)
(Continued)

(52) U.S. Cl.
CPC ............ *G02B 3/0056* (2013.01); *G02B 1/113* (2013.01); *G02B 3/0018* (2013.01);
(Continued)

(58) Field of Classification Search
CPC ........ G02B 3/0056; G02B 7/34; G02B 1/113; G02B 3/0025; G02B 3/0031; G02B 3/0018
See application file for complete search history.

(56) References Cited

U.S. PATENT DOCUMENTS

2001/0036014 A1* 11/2001 Sasano ................. G02B 3/0018
359/619
2009/0122171 A1* 5/2009 Suzuki ............... H04N 5/23212
348/294

FOREIGN PATENT DOCUMENTS

CN       102881699 A      1/2013
JP       2000-206310      7/2000
(Continued)

OTHER PUBLICATIONS

Office Action for JP Patent Application No. 2013-197861, dated Mar. 2, 2017, 04 pages.
(Continued)

*Primary Examiner* — Joseph P Martinez
(74) *Attorney, Agent, or Firm* — Chip Law Group

(57) ABSTRACT

The present technology relates to a lens array and a manufacturing method therefor, a solid-state imaging apparatus, and an electronic apparatus that can improve the AF performance while suppressing the deterioration of image quality. A lens array includes microlenses that are formed corresponding to phase difference detection pixels that are provided to be mixed in imaging pixels. Each of the microlenses is formed such that a lens surface thereof is a substantially spherical surface, the microlens has a rectangular shape in a planar view and four corners are not substantially rounded, and a bottom surface in vicinity of an opposite-side boundary portion that includes an opposite-side center portion of a pixel boundary portion in a cross-sectional view is higher than a bottom surface in vicinity of (Continued)

a diagonal boundary portion that includes a diagonal boundary portion. The present technology is applicable to a lens array of a CMOS image sensor, for example.

6 Claims, 24 Drawing Sheets

(51) Int. Cl.
*H01L 27/146* (2006.01)
*G02B 1/113* (2015.01)
*G02B 7/34* (2006.01)
*H04N 5/369* (2011.01)
*G03B 13/36* (2006.01)

(52) U.S. Cl.
CPC ......... *G02B 3/0025* (2013.01); *G02B 3/0031* (2013.01); *G02B 7/34* (2013.01); *H01L 27/1462* (2013.01); *H01L 27/14621* (2013.01); *H01L 27/14623* (2013.01); *H01L 27/14627* (2013.01); *H01L 27/14645* (2013.01); *H01L 27/14685* (2013.01); *G03B 13/36* (2013.01); *H04N 5/3696* (2013.01)

(56) References Cited

FOREIGN PATENT DOCUMENTS

| JP | 2000-206310 A | 7/2000 |
|---|---|---|
| JP | 2003-258224 A | 9/2003 |
| JP | 2006-073605 A | 3/2006 |
| JP | 2007-101661 | 4/2007 |
| JP | 2007-101661 A | 4/2007 |
| JP | 2008-009079 A | 1/2008 |
| JP | 2008-052004 | 3/2008 |
| JP | 2008-052004 A | 3/2008 |
| JP | 2009-109965 | 5/2009 |
| JP | 2009-109965 A | 5/2009 |
| JP | 2010-129783 | 6/2010 |
| JP | 2010-129783 A | 6/2010 |
| JP | 2010-181485 | 8/2010 |
| JP | 2010-181485 A | 8/2010 |
| JP | 2011-013411 A | 1/2011 |
| JP | 2012-134261 | 7/2012 |
| JP | 2013-021168 | 1/2013 |
| JP | 2013-021168 A | 1/2013 |
| JP | 2013-077740 | 4/2013 |
| JP | 2013-077740 A | 4/2013 |
| WO | 2004/006336 A1 | 1/2004 |

OTHER PUBLICATIONS

Office Action for JP Patent Application No. 2013-197861, dated May 23, 2017, 03 pages of Office Action and 02 pages of English Translation. (Decision to Decline the Amendment).

Office Action for JP Patent Application No. 2013-197861, dated May 23, 2017, 02 pages of Office Action and 01 pages of English Translation. (Decision of Refusal).

Office Action for JP Patent Application No. 2013-197861, dated Sep. 27, 2016, 4 pages.

Office Action for JP Patent Application No. 2013-197861, dated Sep. 21, 2017, 2 pages of Office Action and 2 pages of English Translation.

Office Action for JP Patent Application No. 2013-197861, dated Apr. 10, 2018, 08 pages of Office Action and 09 pages of English Translation.

Office Action for CN Patent Application No. 201480051607.0, dated Jul. 3, 2018, 05 pages of Office Action and 09 pages of English Translation.

* cited by examiner

LENS ARRAY AND MANUFACTURING METHOD THEREFOR, SOLID-STATE IMAGING APPARATUS, AND ELECTRONIC APPARATUS

TECHNICAL FIELD

The present technology relates to a lens array and a manufacturing method therefor, a solid-state imaging apparatus, and an electronic apparatus and more particularly to a lens array and a manufacturing method therefor, a solid-state imaging apparatus, and an electronic apparatus by which AF performance can be improved while suppressing the deterioration of image quality.

BACKGROUND ART

In an imaging apparatus, an AF (Auto Focus) system to automatically focus is roughly classified into a contrast detection system and a phase difference detection system. The phase difference detection system is excellent in that a high-speed AF motion is possible in comparison with the contest detection system.

As the phase difference detection, system, a pupil division phase difference detection system is generally known. The pupil division phase difference detection system is a system in which pixels for phase difference detection (for focus detection) (hereinafter, referred to as phase difference detection pixels) as well as imaging pixels are provided in the same light-receiving region (imaging region) and AF measurement is performed on an imaging surface, that is, a phase difference detection signal representing an offset direction and offset amount of a focal point is obtained.

In the case where the phase difference detection pixels are incorporated in the imaging region of the solid-state imaging apparatus, it is necessary to maintain the high sensitivity characteristics of the imaging pixels and to increase the sensitivity of the phase difference detection of the phase difference detection pixels and improve the AF performance. Therefore, conventionally, regarding a light-shielding film formed with an opening corresponding to a pixel, the opening is formed to be smaller than an imaging pixel and the focal point of a microlens corresponding to a phase difference detection pixel is set to provide a front-focus state (e.g., see Patent Document 1). Here, the "front-focus state" means a state in which the focal point is offset to the front with respect to a subject.

Patent Document 1: Japanese Patent Application Laid-open No. 2009-109965

SUMMARY OF INVENTION

Problem to be Solved by the Invention

However, in the technology of Patent Document 1, the shape of the microlens in a planar view is set to a circular shape for setting the focus of the microlens corresponding to the phase difference detection pixel to be the front-focus, and hence a gap is formed between the adjacent pixels.

As a result, there has been a fear that light entering the gap may enter the adjacent pixels and color mixing may occur or light that cannot be collected by the microlens may be reflected to a wiring metal or the like formed in a layer below the microlens with the result that flare may occur, which deteriorates the quality of an image to be output.

The present technology has been made in view of the above-mentioned situations to improve the AF performance while suppressing the deterioration of image quality.

Means for Solving the Problem

A lens array according to an aspect of the present technology includes a microlens that is formed corresponding to a phase difference detection pixel that is provided to be mixed in an imaging pixel, the microlens being formed such that a lens surface thereof is a substantially spherical surface, the microlens has a rectangular shape in a planar view and four corners are not substantially rounded, and a bottom surface in vicinity of an opposite-side boundary portion that includes an opposite-side center portion of a pixel boundary portion in a cross-sectional view is higher than a bottom surface in vicinity of a diagonal boundary portion that includes a diagonal boundary portion.

The microlens may be formed such that the microlens has a square shape in a planar view, and a first curvature radius that is a curvature radius of the lens surface in a cross-section of the opposite-side center portion and a second curvature radius that is a curvature radius of the lens surface in a cross-section of the diagonal boundary portion are approximately equal.

A pixel size of the phase difference detection pixel may be set to be equal to or larger than 3 μm, and if the curvature radius r of the lens surface is expressed by $r=(d^2+4t^2)/8t$ where d denotes a width of a bottom surface in a cross-section extending through a top of the leas surface and t denotes a height of the top of the lens surface with the bottom surface being a reference, a curvature radius ratio r1/r2 that is a ratio between the first curvature radius r1 and the second curvature radius r2 may be set to a value included in a range of from 0.98 to 1.20.

At least one inorganic film may be formed as an antireflection film on a top surface of the lens surface.

The inorganic film may make a difference between the first curvature radius r1 and the second curvature radius r2 smaller.

A manufacturing method for a lens array according to an aspect of the present technology is a manufacturing method for a lens array including a microlens that is formed corresponding to a phase difference detection pixel that is provided to be mixed in an imaging pixel. The method includes the step of: forming the microlens such that a lens surface thereof is a substantially spherical surface, the microlens has a rectangular shape in a planar view and four corners are not substantially rounded, and a bottom surface in vicinity of an opposite-side boundary portion that includes an opposite-side center portion of a pixel boundary portion in a cross-sectional view is higher than a bottom surface in vicinity of a diagonal boundary portion that includes a diagonal boundary portion.

A solid-state imaging apparatus according to an aspect of the present technology includes a lens array including microlenses each being formed corresponding to a phase difference detection pixel that is provided to be mixed in an imaging pixel, the microlens being formed such that a lens surface thereof is a substantially spherical surface, the microlens has a rectangular shape in a planar view and four corners are not substantially rounded, and a bottom, surface in vicinity of an opposite-side boundary portion that includes an opposite-side center portion of a pixel boundary portion in a cross-sectional view is higher than a bottom surface in vicinity of a diagonal boundary portion that includes a diagonal boundary portion.

An electronic apparatus according to an aspect of the present technology includes a solid-state imaging apparatus including a lens array including microlenses each being formed corresponding to a phase difference detection pixel that is provided to be mixed in an imaging pixel, the microlens being formed such that a lens surface thereof is a substantially spherical surface, the microlens has a rectangular shape in a planar view and four corners are not substantially rounded, and a bottom surface in vicinity of an opposite-side boundary portion that includes an opposite-side center portion of a pixel boundary portion in a cross-sectional view is higher than a bottom surface in vicinity of a diagonal boundary portion that includes a diagonal boundary portion.

In an aspect of the present technology, a microlens is formed such that a lens surface thereof is a substantially spherical surface, the microlens has a rectangular shape in a planar view and four corners are not substantially rounded, and a bottom surface in vicinity of an opposite-side boundary portion that includes an opposite-side center portion of a pixel boundary portion in a cross-sectional view is higher than a bottom surface in vicinity of a diagonal boundary portion that includes a diagonal boundary portion.

Effects of the Invention

According to an aspect of the present technology, it becomes possible to improve the AF performance while suppressing the deterioration of image quality.

MODE(S) FOR CARRYING OUT THE INVENTION

Hereinafter, an embodiment according to the present technology will be described with reference to the drawings.

<Configuration Example of Solid-State Imaging Apparatus>

Figure 1:
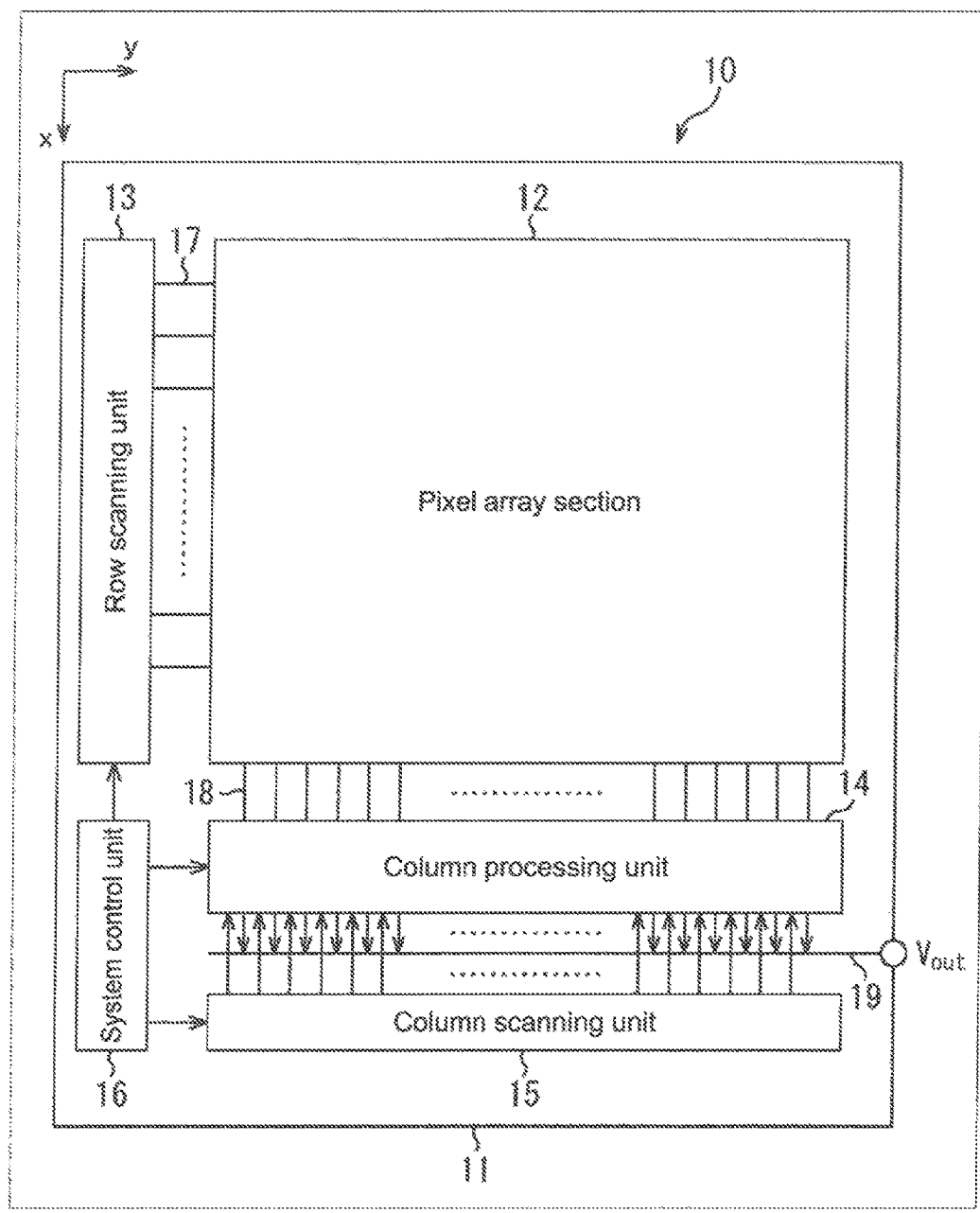
FIG. 1 A block diagram showing an embodiment of an image sensor to which the present technology is applied.

FIG. 1 is a block diagram, showing an embodiment of a solid-state imaging apparatus to which the present technology is applied. Hereinafter, a configuration of a CMOS (Complementary Metal Oxide Semiconductor) image sensor as one of amplification type solid-state imaging apparatuses will be described. Note that the present technology is not limited to application to the CMOS image sensor and is also applicable to other amplification type solid-state imaging apparatuses and charge-transfer type solid-state imaging apparatuses such as a CCD (Charge Coupled Device) image sensor.

A CMOS image sensor 10 shown in FIG. 1 is configured to include a pixel array section 12 formed on a semiconductor substrate (hereinafter, referred to as chip) 11 and a peripheral circuit section integrated on the same chip 11 as the pixel array section 12. In this example, a row scanning unit 13, a column processing unit 14, a column scanning unit 15, and a system control unit 16 are, for example, provided as the peripheral circuit section.

In the pixel array section 12, unit pixels (hereinafter, also simply referred to as pixels) are arranged in a two-dimensional matrix form. The unit pixel includes a photoelectric conversion unit that generates photocharges having a charge amount corresponding to the light amount of incident light and accumulates them therein. The term "unit pixel" set forth herein means an imaging pixel for obtaining an imaging signal. A specific circuit configuration of a unit pixel (imaging pixel) will be described later.

In addition, in the pixel array section 12, with respect to the pixel arrangement in the matrix form, pixel driving lines 17 are arranged along a row direction (arrangement direction of pixels in pixel row) for each pixel row and vertical signal lines 18 are arranged along a column direction (arrangement direction of pixels in pixel column) for each pixel column. The pixel driving lines 17 transmit driving signals for driving the pixels. The driving signals are output from the row scanning unit 13 for each row. Although the pixel driving line 17 is shown as a single wire in FIG. 1, it is not limited to the single wire. One ends of the pixel driving lines 17 are connected to output ends corresponding to the rows of the row scanning unit 13.

The row scanning unit 13 is constituted of a shift resistor, an address decoder, or the like and drives the pixels of the pixel array section 12 for each row, for example. Although the illustration of a specific configuration of the row scanning unit 13 is omitted, a configuration including two scanning systems of a read-out scanning system and a sweep-out scanning system is generally adopted.

The read-out scanning system sequentially selectively scans the unit pixels of the pixel array section 12 for each row in order to read out signals from the unit pixels. The signals read out from the unit pixels are analog signals. With respect to the read-out row on which the read-out scanning is performed by the read-out scanning system, the swipe-out scanning system performs sweep-out scanning, preceding the read-out scanning by the amount of time of the shutter speed.

As a result of the sweep-out scanning by the swipe-out scanning system, unnecessary charges are swept out from the photoelectric conversion units of the unit pixels in the read-out row and the photoelectric con version units are reset. Then, by sweeping out (resetting) unnecessary charges by the swipe-out scanning system, a so-called electronic shutter operation is performed. Here, the electronic shutter operation means, an operation of discarding the photocharges of the photoelectric conversion units and starting new exposure (starting photocharge accumulation).

The signals read out in the read-out operation by the read-out scanning system correspond to the amount of incident light after the previous read-out operation or electronic shutter operation. A period from a read-out timing of the previous read-out operation or a sweep-out timing of the electronic shutter operation to a read-out timing of the current read-out operation is an accumulation period (exposure period) of photocharges in the unit pixels.

The signals output from the unit pixels in the pixel row that is selectively scanned by the row scanning unit 13 are supplied to the column processing unit 14 through the respective vertical signal lines 18. For each of the pixel columns of the pixel array section 12, the column processing unit 14 performs predetermined signal processing on signals output from the pixels in the selected row through the vertical signal lines 18 and temporarily retains the pixel signals after signal processing.

Specifically, the column processing unit 14 receives a signal of the unit pixel and performs signal processing, for example, noise elimination by CDS (Correlated Double Sampling), signal amplification, or AD (Analog-Digital) conversion, on the signal. Due to the noise elimination processing, fixed-pattern noise specific to the pixel for example, reset noise, or variations in threshold of an amplification transistor is eliminated. Note that the signal processing shown here is merely an example and foe signal processing is not limited thereto.

The column scanning unit 15 is constituted of the shift resistor, the address decoder, and the like and performs scanning by sequentially selecting unit circuits corresponding to the pixel columns of the column processing unit 14. By selective scanning by the column scanning unit 15, the pixel signals subjected to signal processing by the unit circuits of the column processing unit 14 are sequentially output to a horizontal bus 19 and transmitted to the outside of the chip 11 through the horizontal bus 19.

The system, control unit 16 receives clocks supplied from the outside of the chip 11, data for designating an operation mode, and the like and outputs data on internal information and the like of the CMOS image sensor 10. In addition, the system control unit 16 includes a timing generator that generates various timing signals and performs driving control on the peripheral circuit section such as the row scanning unit 13, the column processing unit 14, and the column scanning unit 15 based on the various timing signals generated by the timing generator.

<Circuit Configuration of Unit Pixel>

Figure 2:
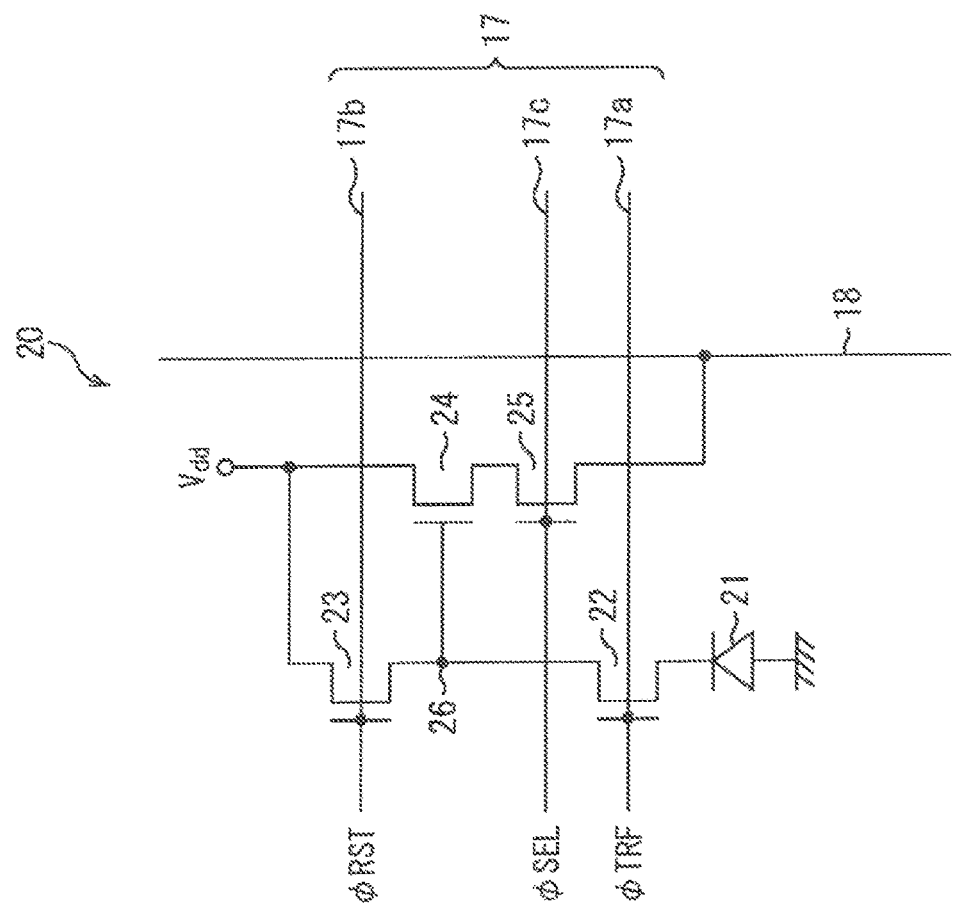
FIG. 2 A diagram showing an example of a circuit configuration of a unit pixel.

FIG. 2 is a circuit diagram showing an example of a circuit configuration of the unit pixel.

As shown in FIG. 2, a unit pixel 20 includes, for example, a photodiode 21 as the photoelectric conversion unit. Furthermore, in addition to the photodiode 21, the unit pixel 20 includes, for example, four transistors of a transfer transistor (read-out gate section) 22, a reset transistor 23, an amplification transistor 24, and a selection transistor 25.

Here, N-channel MOS transistors, for example, are used as the four transistors. Note that the conductivity type combination of the transfer transistor 22, reset transistor 23, amplification transistor 24, and selection transistor 25 exemplified here is merely an example and they are not limited to this combination.

Furthermore, with respect to the unit pixel 20, three driving lines of a transfer line 17a, a reset line 17b, and a selection line 17c, for example, are provided as the pixel driving lines 17 in common with, the pixels of the same pixel row. The transfer line 17a, the reset line 17b, and the selection line 17c are at one ends thereof connected to output ends corresponding to each pixel row of the row scanning unit 13 for each pixel row and transmit a transfer pulse φTRF, a reset pulse φ-RST, and a selection pulse φSEL that are driving signals for driving the unit pixel 20.

An anode electrode of the photodiode 21 is connected to a negative-side power supply (e.g., ground) to photoelectrically convert received light (incident light) into photocharges having a charge amount corresponding to a light amount thereof and accumulate the photocharges. A cathode electrode of the photodiode 21 is electrically connected to a gate electrode of the amplification transistor 24 via the transfer transistor 22. A node electrically connected to the gate electrode of the amplification transistor 24 will be referred to as an FD (floating diffusion) section 26.

The transfer transistor 22 is connected between the cathode electrode of the photodiode 21 and the FD unit 26. The gate electrode of the transfer transistor 22 is supplied with the transfer pulse φTRF with a high level (e.g., Vdd level) being active (hereinafter, referred to as high-active) via the transfer line 17a. With this, the transfer transistor 22 is brought into a conduction state and photocharges photoelectrically converted by the photodiode 21 are transferred to the FD unit 26.

Regarding the reset transistor 23, a drain electrode is connected to a pixel power supply Vdd and a source electrode is connected to the FD unit 26. The gate electrode of the reset transistor 23 is supplied with the high-active reset pulse φRST via the reset line 17b. With this, the reset transistor 23 is brought into a conduction state, and the FD unit 26 is reset by discarding charges of the FD unit 26 to the pixel power supply Vdd.

Regarding the amplification transistor 24, a gate electrode is connected to the FD unit 26 and a drain electrode is connected to the pixel power supply Vdd. The amplification transistor 24 outputs a potential of the FD unit 26 after it is reset by the reset transistor 23, as a reset signal (reset level)

Vrst. In addition, the amplification transistor 24 outputs a potential of the FD unit 26 after signal charges are transferred by the transfer transistor 22, as a light accumulation signal (signal level) Vsig.

Regarding the selection transistor 25, for example, a drain electrode is connected to the source electrode of the amplification transistor 24 and a source electrode is connected to the vertical signal line 18. The gate electrode of the selection transistor 25 is supplied with the high-active selection pulse φSEL via the selection line 17c. With this, the selection transistor 25 is brought into a conduction state, the unit pixel 20 is selected, and a signal supplied from the amplification transistor 24 is output to the vertical signal line 18.

Although, in the example of FIG. 2, the selection transistor 25 is set to have a circuit configuration in which it is connected between the source electrode of the amplification transistor 24 and the Vertical signal line 18, it is also possible to adopt a circuit configuration in which the selection transistor 25 is connected between the pixel power supply Vdd and the drain electrode of the amplification transistor 24.

Furthermore, the unit pixel 20 is not limited to one having the pixel configuration in which it is formed of the above-mentioned four transistors. For example, one having a pixel configuration in which it is formed of three transistors one of which serves as both of the amplification transistor 24 and the selection transistor 25 may be adopted. In this case, the pixel circuit can have any configuration.

<Structure Example of Phase Difference Detection Pixel>

The above-mentioned CMOS image sensor 10 includes phase difference detection pixels for obtaining phase difference detection signals in order to realize pupil-division-type phase difference detection. The phase difference detection signal is a signal representing an offset direction (defocus direction) and an offset amount (defocus amount) of a focal point.

The phase difference detection pixels are provided to be mixed in the pixel array section 12 (effective pixel region) shown in FIG. 1, which is formed by arranging the imaging pixels (unit pixels 20) in a two-dimensional matrix form. Specifically, the phase difference detection pixels are provided in the effective pixel region to intersect in left, right, upper and lower directions, for example.

Figure 3:
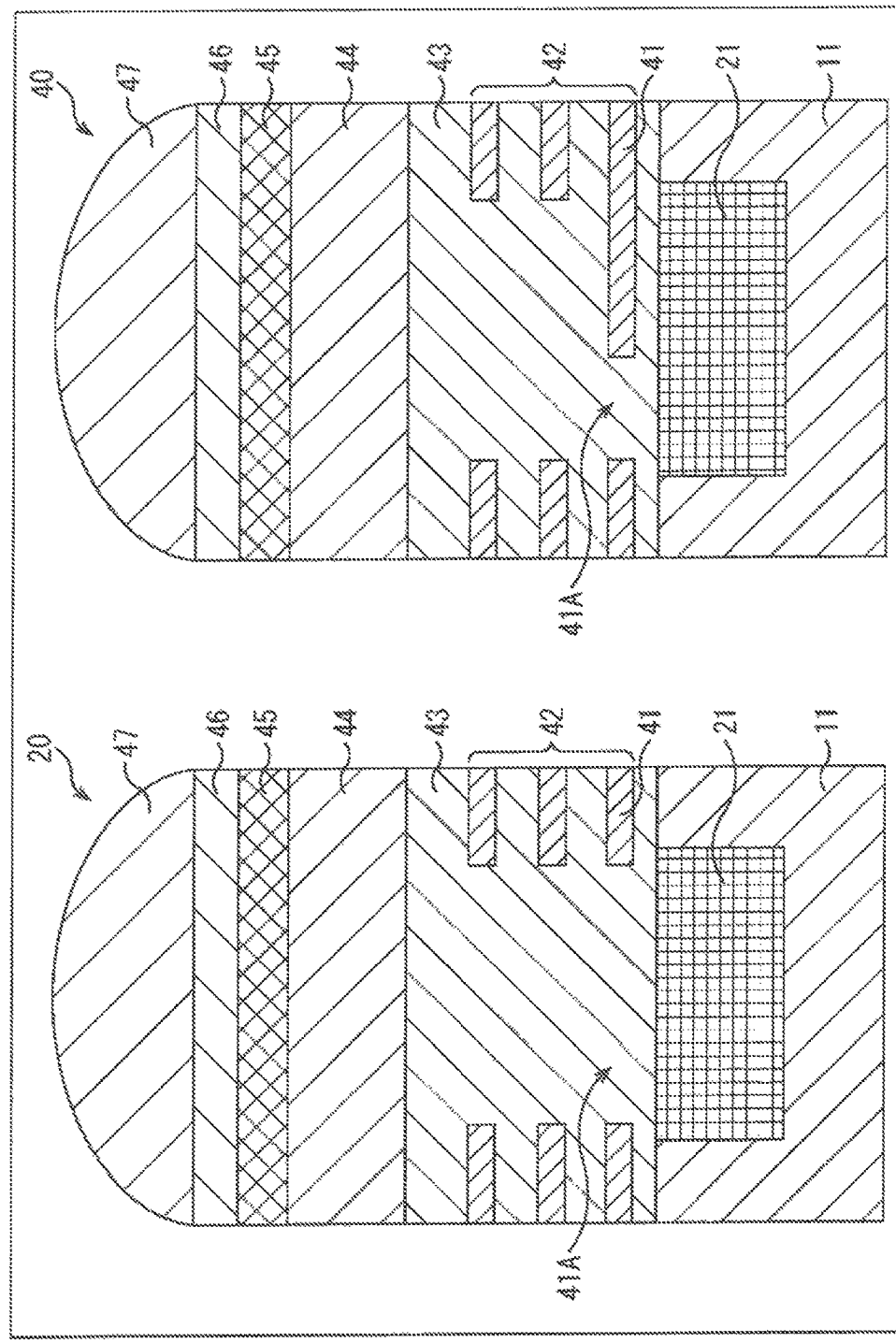
FIG. 3 A cross-sectional view showing structure examples of an imaging pixel and a phase difference detection pixel.
Figure 4:
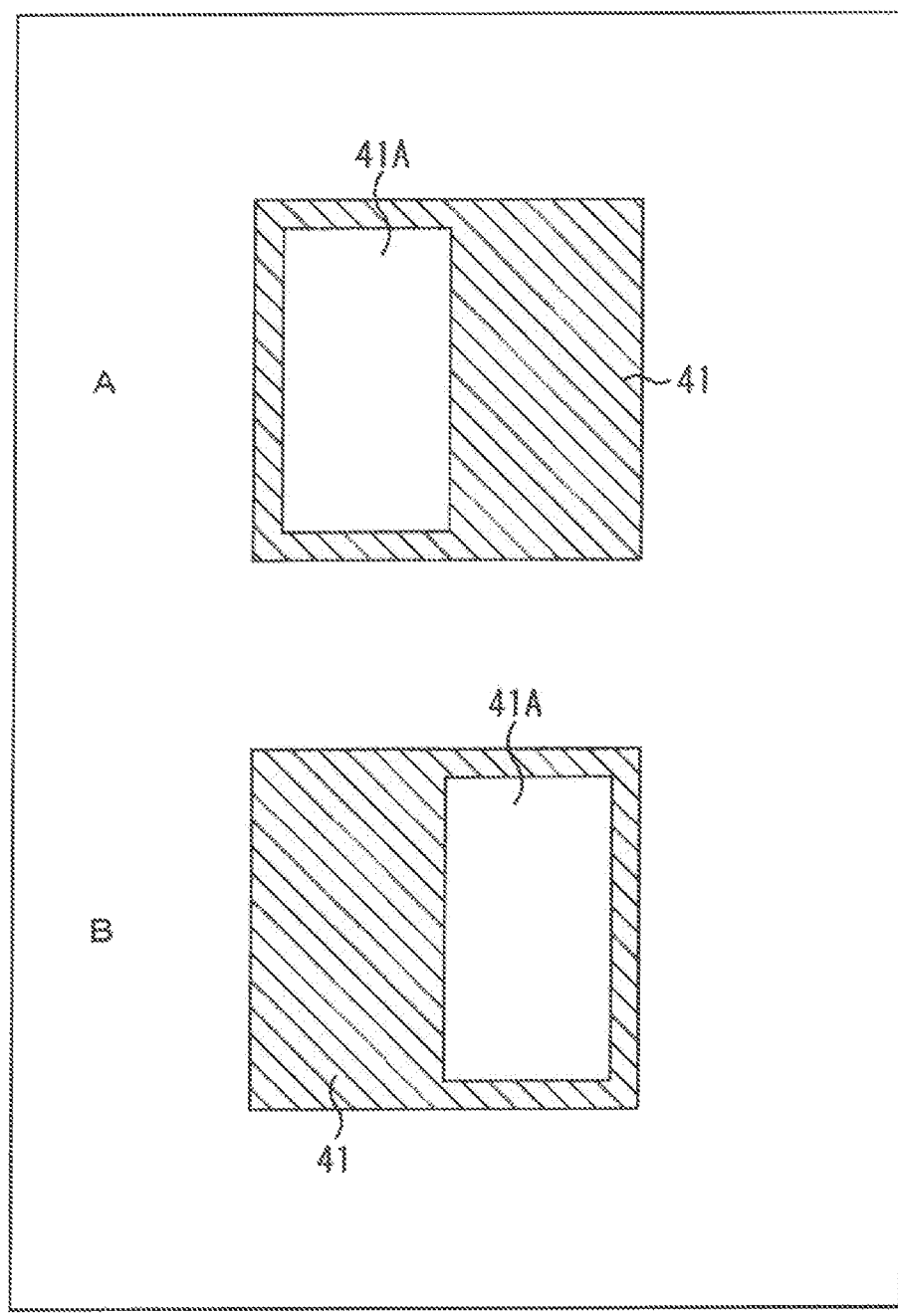
FIG. 4 A diagram showing examples of light-shielding films of phase difference detection pixels.

The pixel circuit shown in FIG. 2 is a pixel circuit in common with the imaging pixel and the phase difference detection pixel. The phase difference detection pixel has a structure slightly different from that of the imaging pixel. Here, an example of the structure of the phase difference detection pixel will be described with reference to FIGS. 3 and 4. FIG. 3 shows a cross-sectional view of the imaging pixel and the phase difference detection pixel. FIG. 4 shows a plane view of the light-shielding films of the phase difference detection pixels.

An imaging pixel 20 and a phase difference detection pixel 40 each have the following configuration. Specifically, the photodiode 21 that is the photoelectric conversion unit is formed in a surface layer portion of a semiconductor substrate 11 and a light-shielding film 41 is provided on a side of a light-receiving surface of the photodiode 21. The light-shielding film 41 in the imaging pixel 20 includes an opening 41A provided corresponding to the light-receiving surface of the photodiode 21 (light-receiving region). On the other hand, the light-shielding film 41 in the phase difference detection pixel 40 is a light-shielding film for detecting a phase difference and includes the opening 41A through which one of pupil-divided light beams passes. In view of the size of the opening 41A provided in the light-shielding film 41, the phase difference detection pixel 40 is structurally different from the imaging pixel 20. The size of the opening 41A of the light-shielding film 41 in the phase difference detection pixel 40 is about a half of the unit pixel in a planar view as shown in FIG. 4.

As shows in FIG. 3, the light-shielding film 41 is formed in a state in which, as a part of a wiring layer 42, specifically, a lowermost wiring layer of the wiring layer 42 also serves as the light-shielding film. An insulation film 44 is laminated on an interlayer insulation film 43 including the light-shielding film 41 and the wiring layer 42, a color filter 45 is laminated on the insulation film 44, a planarization film 46 formed of an acrylic resin or the like is laminated on the color filter 45, and a microlens (on-chip lens) 47 is laminated on the planarization film 46.

Note that, other than being formed to also serve as the lowermost wiring layer of the wiring layer 42, a dedicated light-shielding film 41 may be formed separately from the wiring layer 42. The light-shielding film 41 is formed of a material having a light-shielding property such as tungsten (W), titanium (Ti), aluminum (Al), and copper (Cu). Note that the structure of the light-shielding film 41 shown in A and B of FIG. 4 is for a case where the phase difference detection pixels are arranged in left and right directions in the effective pixel region to split left and right luminous fluxes from an exit pupil. The structures of the light-shielding films 41 in the phase difference detection pixels 40 in the case where they are arranged in upper and lower directions in the effective pixel region are structures obtained by rotating the openings 41A by 90 degrees in A and B of FIG. 4.

<Focal Position in Phase Difference Detection Pixel>

As described above, the phase difference detection pixel 40 and the imaging pixel (unit pixel) 20 are structurally different also in the focal distance of a microlens 47 in addition to the difference in the size of the opening 41A provided in the light-shielding film 41.

For keeping high sensitivity characteristics of the imaging pixel 20, it is favorable that the microlens (first microlens) formed corresponding to the imaging pixel 20 is formed such that the focal position is positioned in the light-receiving surface of the photodiode 21. On the other hand, for keeping a good phase difference detection characteristic of the phase difference detection pixel 40, it is favorable that the microlens (second microlens) formed corresponding to the phase difference detection pixel 40 is formed such that the focal position is positioned in the light-shielding film 41.

From such a reason, it is favorable that the microlens formed corresponding to the phase difference detection pixel 40 is formed such that the focal distance is shorter in comparison with the microlens formed corresponding to the imaging pixel 20. The shorter focal distance means that the local position of the microlens formed corresponding to the phase difference detection pixel 40 is located at a position away from the light-receiving surface of the photodiode 21.

Figure 5:
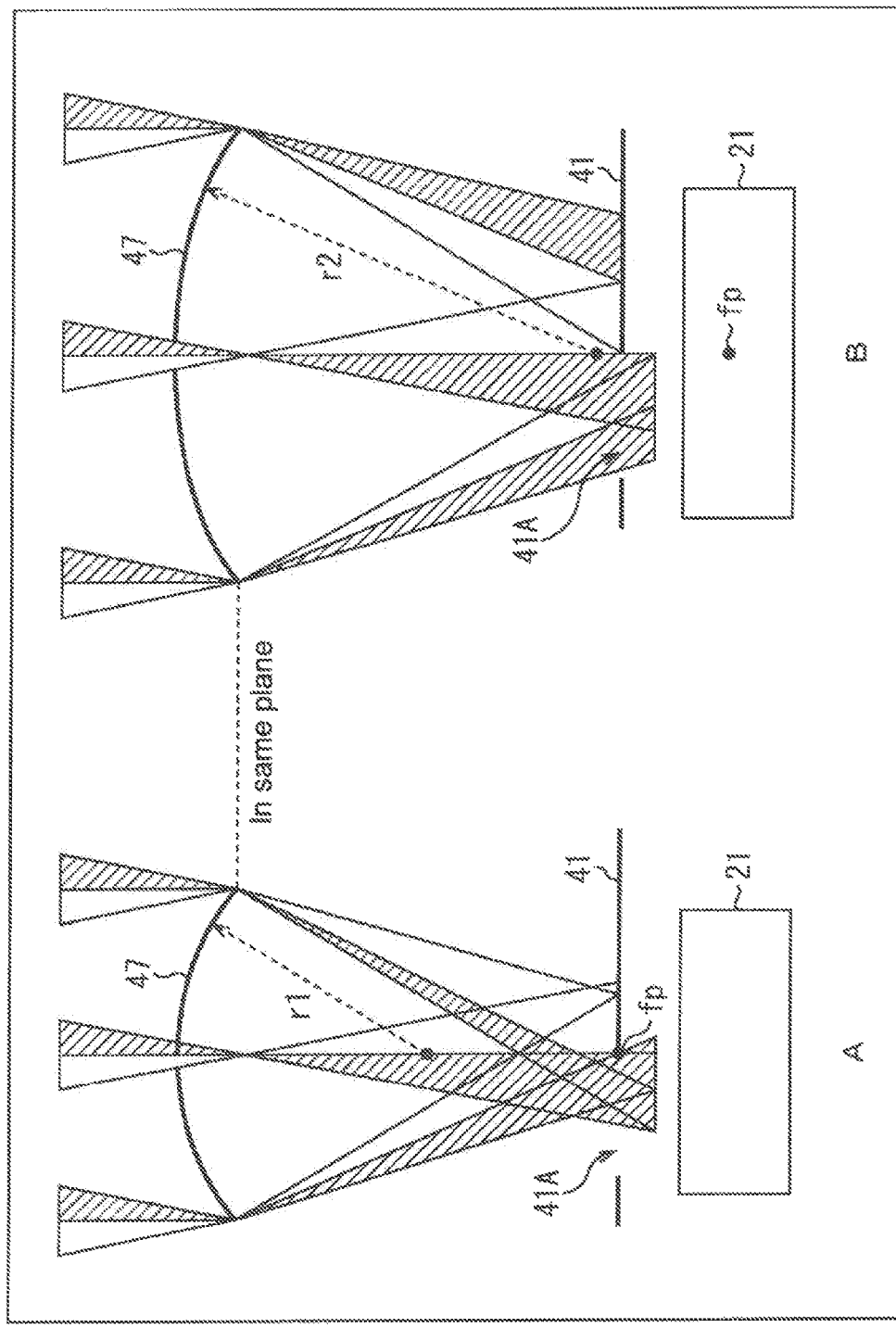
FIG. 5 A diagram for describing a focal position in a conventional phase difference detection pixel.

Here, with reference to FIG. 5, a relationship between the microlens 47, which is generally formed corresponding to the phase difference detection pixel 40, and the light-shielding film 41 will be described. A of FIG. 5 schematically shows a cross-section of the microlens 47 in an opposite-side direction. B of FIG. 5 schematically shows a cross-section of the microlens 47 in a diagonal direction. Note that the microlens 47 is formed in an approximately square shape in a planar view.

Here, the opposite-side direction indicates a pixel arrangement direction. The pixel arrangement direction is set to a row direction x or column direction y shown in FIG.

1, for example. In this example, the opposite-side direction indicates a horizontal direction of the pixel array section 12 of FIG. 1. Furthermore, the diagonal direction is set to a diagonal direction in the microlens 47 formed in the square shape. Thus, the diagonal direction is tilted with respect to the pixel arrangement direction. In this example, it is assumed that the opposite-side direction indicates an oblique direction of the pixel array section 12 of FIG. 1.

Light (luminous flux) is incident upon the microlens 47 through the region of the exit pupil of an imaging lens (not shown). The light that has passed through the microlens 47 is guided to the light-shielding film 41 including the opening 41A having a size that is about a half of the unit pixel in a planar view. In the example of FIG. 5, the left half of the light-shielding film 41 is the opening 41A. Therefore, it is favorable that only right light beams incident through the region of the exit pupil pass through the opening 41A and are guided to the photodiode 21 located below the light-shielding film 41. At this time, left light beams incident through the region of the exit pupil are shielded by the light-shielding film 41.

Regarding a lens portion of the microlens 47 in the opposite-side direction (horizontal direction) that has a shorter width dimension, as shown in A of FIG. 5, a curvature radius r1 of the lens surface in the cross-section is designed such that a focal position fp is a position in the light-shielding film 41. Thus, light beams incident through the left and right of the exit pupil favorably pass through the opening 41A of the light-shielding film 41 or shielded by the light-shielding film 41.

However, regarding a lens portion in the diagonal direction (oblique direction) that has a longer width dimension than the lens portion in the horizontal direction, a bottom surface thereof is formed in the same plane as the bottom surface of the lens portion in the horizontal direction. Therefore, as shown in B of FIG. 5, a curvature radius r2 of the lens surface in a cross-section thereof is larger than the curvature radius r1 of the lens surface in the cross-section in the horizontal direction. Thus, the focal position fp is located closer to the photodiode 21 than to the light-shielding film 41. In other words, the focal distance is longer. Therefore, the left and right light beams are not favorably split by the light-shielding film 41 and the detection accuracy of the phase difference detection pixel 40 (hereinafter, in some cases referred to as AF detection accuracy) is lowered.

Figure 6:
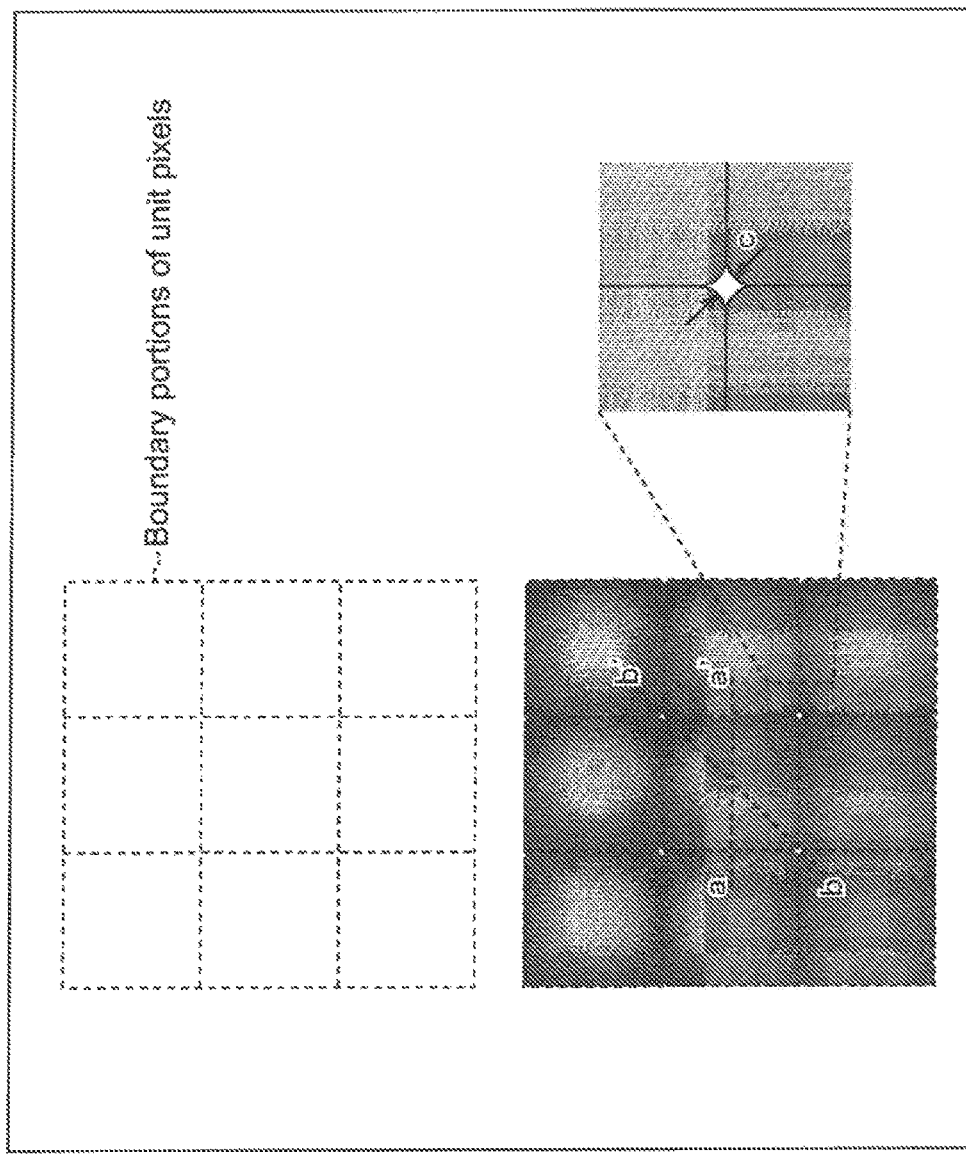
FIG. 6 A plane view showing configuration examples of microlenses of the present technology.

On the other hand, in the CMOS image sensor 10 of the present technology, each of the microlenses 47 that constitute the lens array by being formed corresponding to the pixels arranged in the pixel array section 12 is formed such that a lens surface thereof is a substantially spherical surface, the microlens 47 has a rectangular shape (square shape) corresponding to a boundary portion of the unit pixel in a planar view as shown in FIG. 6, and four corners are not substantially rounded. Specifically, four corners of the microlens 47 are formed such that, as shown in FIG. 6, a distance c between the corners of the microlenses 47 adjacent to each other in the diagonal direction is smaller than 0.4 μm that is a wavelength of light in a visible light region.

Thus, a clearance between the adjacent pixels is little. Therefore, it becomes possible to suppress color mixing due to light entering the adjacent pixels and flare due to light reflected to the wiring layer 42 formed in a layer below the microlens 47 and to suppress the deterioration of image quality.

In addition, the microlens 47 in the CMOS image sensor 10 of the present technology is formed such that, in a cross-sectional view, a bottom surface in vicinity of a diagonal boundary portion that includes the diagonal boundary portion, that is, a bottom surface in the oblique direction (b-b' direction) is lower than a bottom surface in vicinity of an opposite-side boundary portion that includes an opposite-side center portion of a pixel boundary portion, that is, a bottom surface in the horizontal direction (a-a' direction).

Figure 7:
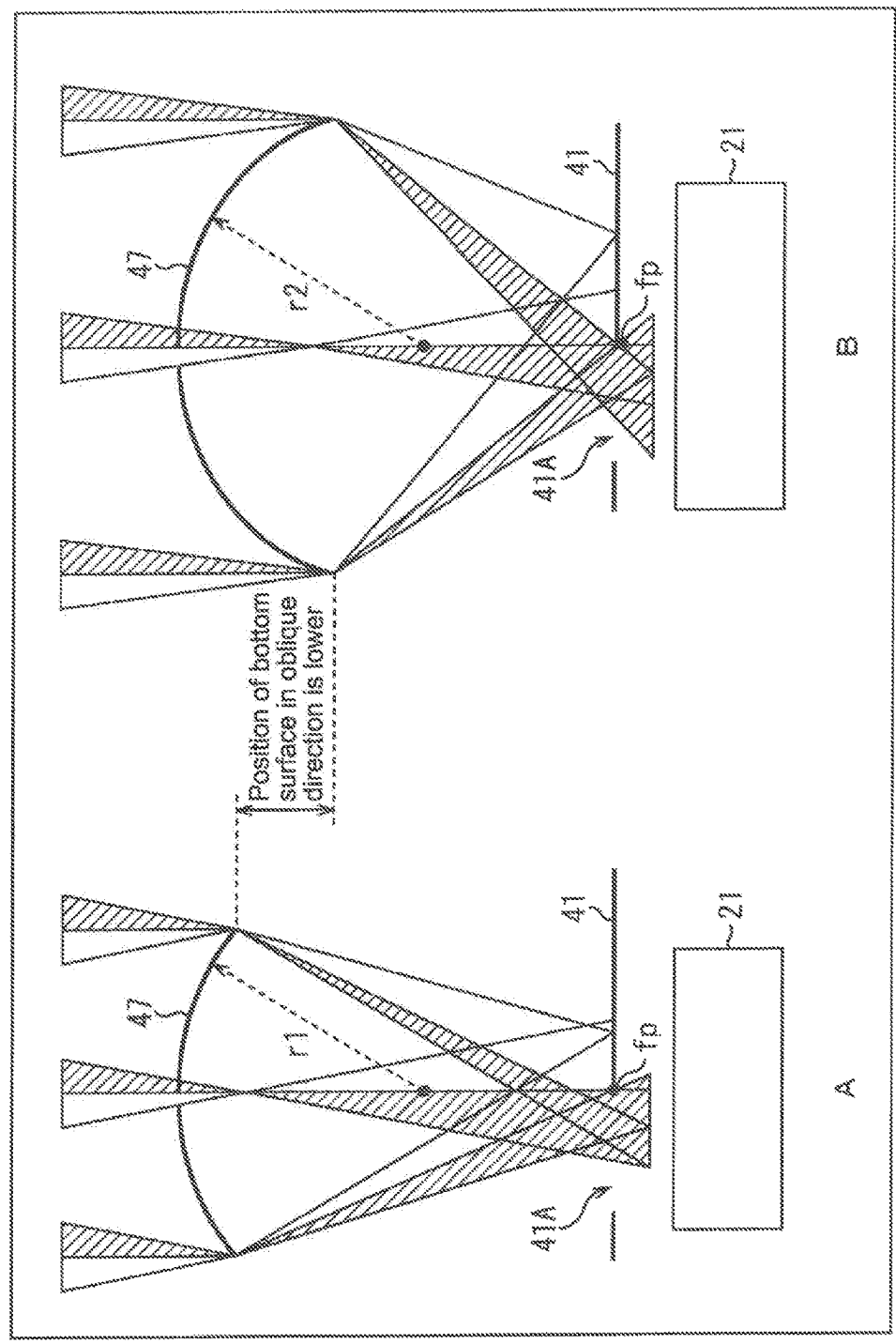
FIG. 7 A diagram for describing a focal position in a phase difference detection pixel of the present technology.

Here, with reference to FIG. 7, a relationship between the microlens 47 of the present technology that Is formed corresponding to the phase difference detection pixel 40 and the light-shielding film 41 will be described. A of FIG. 7 schematically shows cross-section of the microlens 47 in the opposite-side direction. B of FIG. 7 schematically shows a cross-section of the microlens 47 in the diagonal direction. Although the following description will be made assuming that the microlens 47 is formed in an approximately square shape in a planar view, it may be formed in an approximately rectangular shape in a planar view.

In a lens portion of the microlens 47 in the opposite direction (horizontal direction) that has a shorter width dimension, as shown in A of FIG. 7, a curvature radius r1 of a lens surface in the cross-section thereof is designed such that a focal position fp is located in the light-shielding film 41. Therefore, light beams incident through the left and right of the exit pupil favorably passes through the opening 41A of the light-shielding film 41 or are shielded by the light-shielding film 41.

Furthermore, is the lens portion, in the diagonal direction (oblique direction) that has a longer width dimension than that of the lens portion in the horizontal direction, a bottom surface thereof is formed to be lower than the bottom surface of the lens portion in the horizontal direction. Therefore, as shown in B of FIG. 7, a curvature radius r2 of the lens surface in a cross-section thereof substantially equals the curvature radius r1 of the lens surface in the cross-section in the horizontal direction and the focal position fp is a position in the light-shielding film 41. If the microlens 47 is formed such that the position of the bottom surface of the lens portion differ between the horizontal direction and the oblique direction as described above, it is possible to improve the splitting characteristic in the oblique direction while maintaining the good splitting characteristic in the horizontal direction. Thus, the AF detection accuracy becomes good and it becomes possible to improve the AF performance.

Furthermore, as will be described later, it is assumed that the microlens 47 of the present technology is applied to a phase difference detection pixel 40 whose pixel size (length of one side in pixel region, having square shape) is 3 μm or more.

Figure 8:
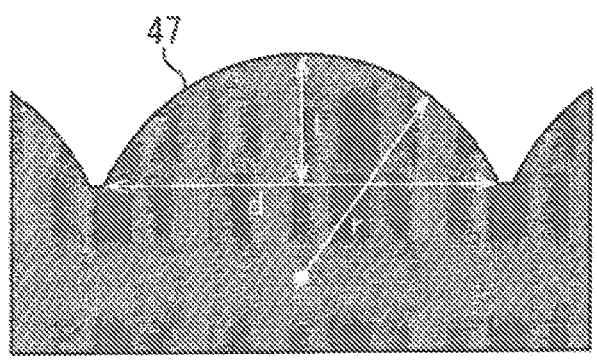
FIG. 8 A diagram for describing a curvature radius of the microlens of the present technology.

In addition, as shown in FIG. 8, if the curvature radius r of the lens surface is expressed by $r=(d^2+4t^2)/8t$ where d indicates the width of the bottom surface in the cross-section extending through the top of the lens-surface and t indicates the height of the top of the lens surface with the bottom surface being a reference, a curvature radius ratio r1/r2 that is a ratio of the curvature radius r1 shows in FIG. 7 to the curvature radius r2 is a value included in a range of from 0.98 to 1.20 in the microlens 47 of the present technology.

<Method of Forming Microlens>

By the way, a thermal melt flow method and a dry etching method are known as general methods of forming a microlens.

The thermal melt flow method is a method in which a microlens material that is a photosensitive resin is applied on a substrate, various types of processing such as pre-baking, exposure, development, and bleaching exposure are sequentially performed, and heat treatment (thermal melt flow) is performed at a temperature that is equal to or higher than a thermal softening temperature of the photosensitive resin for forming convex-shaped lenses thereon. If the floating resins are brought into contact with each other in this heat treatment, the patterns flow due to the surface tension and the lens shapes are collapsed. In view of this, a condition that the photosensitive resin patterns formed corresponding to the adjacent pixels are not fused is set in the heat treatment.

The dry etching method is a method in which the microlens material is formed on the substrate, the photosensitive resin is applied thereon, various types of processing such as pre-baking, exposure, and development are sequentially performed, heat treatment is performed at a temperature that is equal to or higher than a thermal softening temperature of the photosensitive resin for forming a mask layer having a convex lens shape thereon, and this mask layer is etched (transferred) to the microlens material that is a base thereof. According to this method, it is possible to form the microlens that is larger than the dimension of the mask layer in a planar view, and hence to form a lens having a large effective area and high light collection efficiency.

<Considerations of Conventional Dry Etching Method>

Here, for example, a method disclosed in Japanese Patent Application Laid-open No. 2008-52004 as the method of forming a microlens using the dry etching method will be considered.

Figure 9:
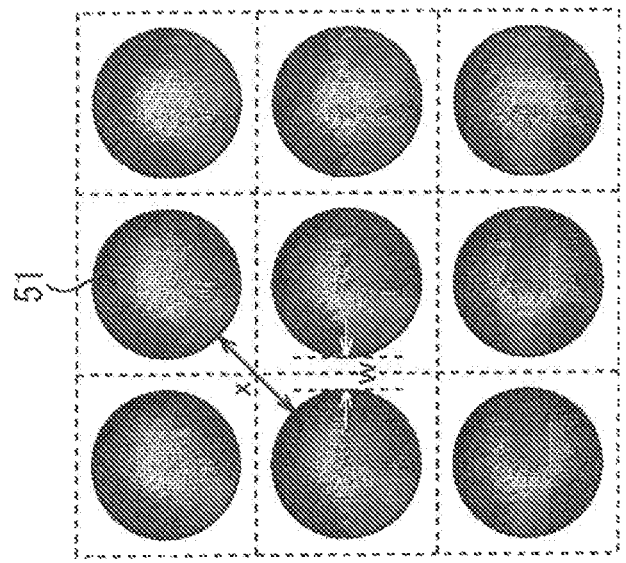
FIG. 9 A diagram for describing a conventional dry etching method.
Figure 9:
Figure 9:
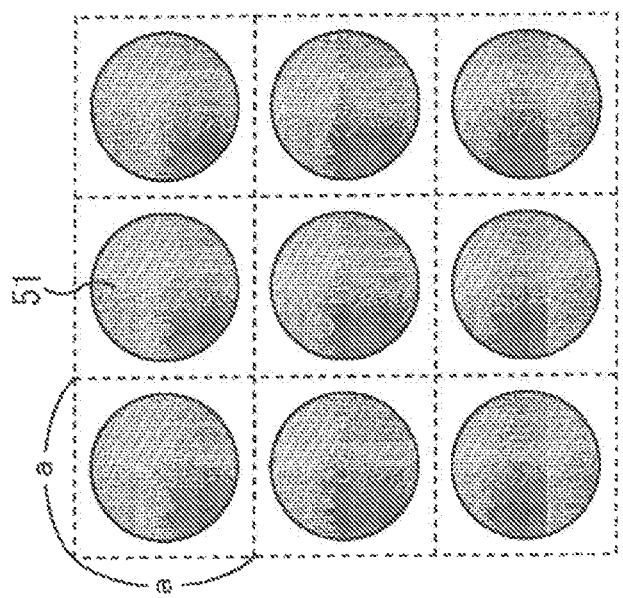

In this method, as shown on the left side of FIG. 9, a resist pattern 51 having a circular shape in a planar view, whose cross-section is rectangular, is first formed in each pixel. Next, by subjecting the resist pattern 51 to heat treatment, the surface of the resist pattern 51 is deformed in a spherical surface lens shape as shown on the right side of FIG. 9. At this time, the resist patterns 51 are deformed such that their curvature radiuses are substantially equal in the circumferential direction. Then, etching back is performed on the entire surface under the condition that the distance between the lenses corresponding to the adjacent pixels is reduced. By etching (transferring) the resist pattern 51 to the microlens material that is a base thereof, a lens array with the reduced distance between the lenses corresponding to the adjacent pixels is formed.

Note that, also in this method, in the case where the heat treatment is performed on the resist pattern 51 having the spherical surface lens shape during formation, the condition that the photosensitive resin patterns formed corresponding to the adjacent pixels are not fused is set.

If the distance between the resist patterns 51 corresponding to the adjacent pixels in the horizontal direction (opposite-side direction) is indicated by w as shown on the right side of FIG. 9, the distance w depends on an exposure apparatus to be used, the material type, and the process conditions (heat treatment temperature, time, etc.) For example, in the case where an i-line stepper is used as the exposure apparatus, the distance w is approximately 0.2 to 0.6 µm. Here, if the pixel size is indicated by a as shown on the left side of FIG. 9 and the distance between the resist patterns 51 corresponding to the adjacent pixels in the oblique direction (diagonal direction) as shown on the right side of FIG. 9 is indicated by x, the distance x is expressed by the approximate equation of $x = a \cdot \sqrt{2} - (a-w)$.

Figure 10:
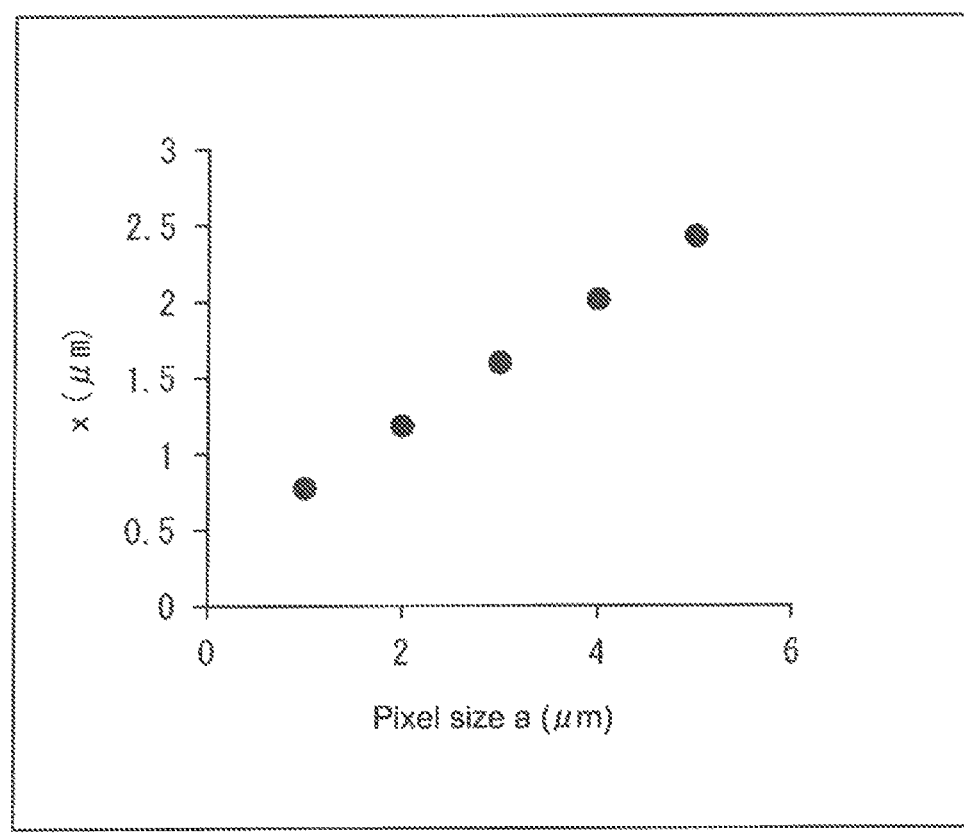
FIG. 10 A diagram for describing a distance between resist patterns corresponding to adjacent pixels with respect to a pixel size.

FIG. 10 is a view showing a relationship between the pixel size a and the distance x in the case where the resist pattern 51 is formed such that the distance w is 0.35 µm based on the above-mentioned approximate equation.

As shown in FIG. 10, as the pixel size becomes larger, the distance x in the diagonal direction also becomes larger.

By the way, the microlens of the present technology is formed to be substantially equal to the pixel region in a planar view, and hence, in this formation process, it is necessary to perform dry etching until the distance w and the distance x become 0. However, as the pixel size becomes larger, the distance w and the distance x between the adjacent pixels also become longer, and hence the time required for the dry etching for setting the distance w and the distance x to 0 becomes longer. For example, in dry etching in the case where the pixel size is 4 µm, the time that is 2.6 times as long as the time required in the case where the pixel size is 1 µm is required. Thus, if the time required for the dry etching becomes longer, it contributes to an increase in manufacturing costs and to performance deterioration due to increased plasma damage and the like of the solid-state imaging apparatus.

<Regarding Method of Forming Microlens According to Present Technology>

Next, a method of forming a microlens according to present technology will be described.

The microlens material is formed on the substrate. A photosensitive resin is applied thereon. It is pre-baked. Then, exposure is started using a photomask 61 as shown in A of FIG. 11. In the photomask 61 shown in A of FIG. 11, the black portions indicate light-shielding portions that shield exposure light and the white portion is a transmissive portion that transmits the exposure light therethrough. Note that, in the photomask 61, the transmissive portion corresponds to portions in which the resist patterns remain after the exposure and the transmissive portion corresponds to a portion, in which the resist patterns are developed and removed after the exposure.

Here, for example, a reduction projection exposure apparatus having a projection magnification of ¼ is used as the exposure apparatus and the i-line or an excimer laser of KrF, ArF, or the like is used as the exposure light. For example, if the i-line is used as the exposure light in the reduction projection exposure apparatus having a projection magnification of ¼, the distance w between the light-shielding portions adjacent in the horizontal direction (opposite-side direction) in the photomask 61 is set to 1.4 µm. In this case, the projection magnification is ¼, and hence the distance when the pattern exposure is actually performed is 0.35 µm.

Figure 11:
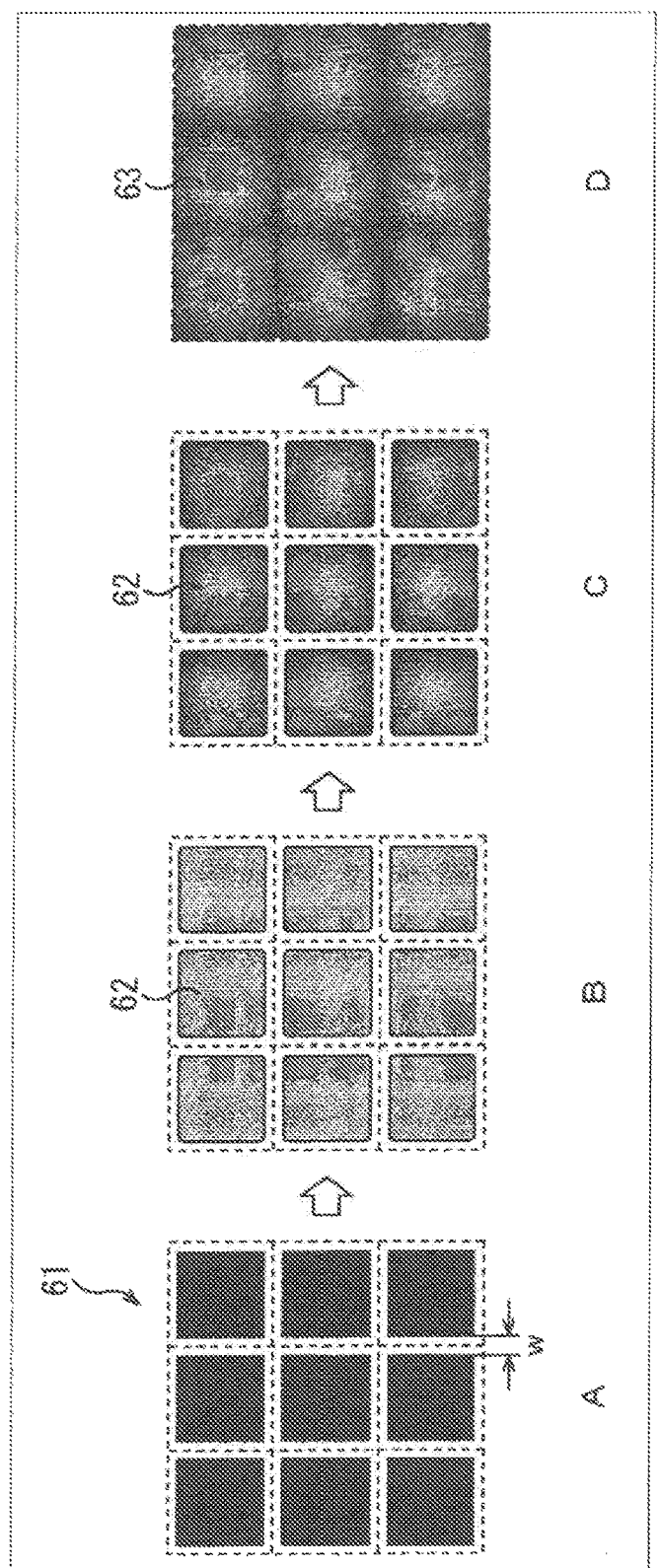
FIG. 11 A diagram for describing a flow of forming microlenses.

Note that, in the photomask 61 shown in A of FIG. 11, the width of the light-shielding portion in the oblique (diagonal) direction that corresponds to the unit pixel is set to √2 times of the width in the horizontal direction.

B of FIG. 11 shows a positive type photoresist pattern that is exposed to the light using the photomask 61 and developed using organic alkaline aqueous solution such as tetramethyl hydroxide and contains a novolak resin or the like as a main component. Note that, in a photoresist pattern 62 formed corresponding to the unit pixel, the four corners are slightly rounded due to influences of optical diffraction and the like during exposure, and hence the width of the photoresist pattern 62 in the oblique (diagonal) direction is slightly smaller than √2 times of the width in the horizontal direction.

When further heat treatment is performed on the photoresist pattern 62 at a temperature that is equal to or higher than a thermal softening temperature thereof from the state of B of FIG. 11, the surface of the photoresist pattern 62 is formed in a spherical surface shape as shown in C of FIG. 11.

The photoresist pattern 62 shown in C of FIG. 11 is etched (transferred) to the microlens material such as a styrene-based resin, which has been formed in a base thereof. This dry etching is performed using, for example, fluorocarbon-based etching gas CF4 until the effective area of the formed microlens is expanded and becomes substantially equal to the pixel region and the space between the microlenses is eliminated. As a result, a microlens 63 that is substantially equal to the pixel region in a planar view as shown in D of FIG. 11 is formed.

The present applicant studied the relationship between the curvature radius ratio and the pixel size (curvature radius r1 of the lens surface in the cross-section in the opposite-side direction/the curvature radius r2 of the lens surface in the cross-section in the diagonal direction) in the case where the microlens 63 is formed with the distance w in A of FIG. 11 being fixed to 1.4 μm according to the above-mentioned method. The result is shown in FIG. 12.

Figure 12:
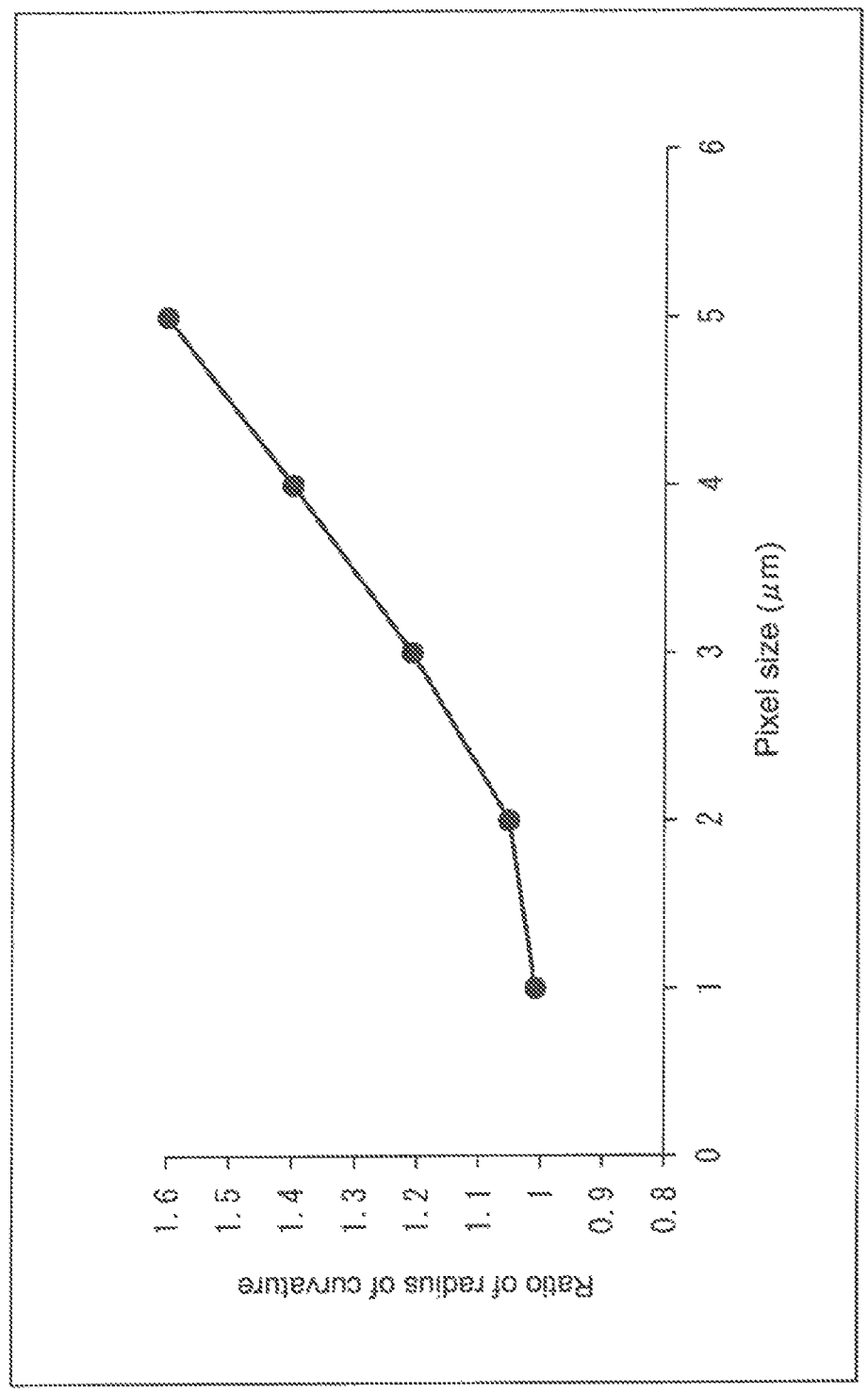
FIG. 12 A diagram for describing a curvature radius ratio with respect to the pixel size.

As shown in FIG. 12, it was found that the curvature radius ratio was smaller than 1.1 when the pixel size was approximately 1 to 2 μm and the curvature radius ratio was beyond 1.2 when the pixel size was beyond 2 μm.

<Dependency Relationship Between Pixel Size and Curvature Radius Ratio>

Here, with reference to FIG. 13, a reason why the curvature radius ratio depends on the pixel size will be described.

Figure 13:
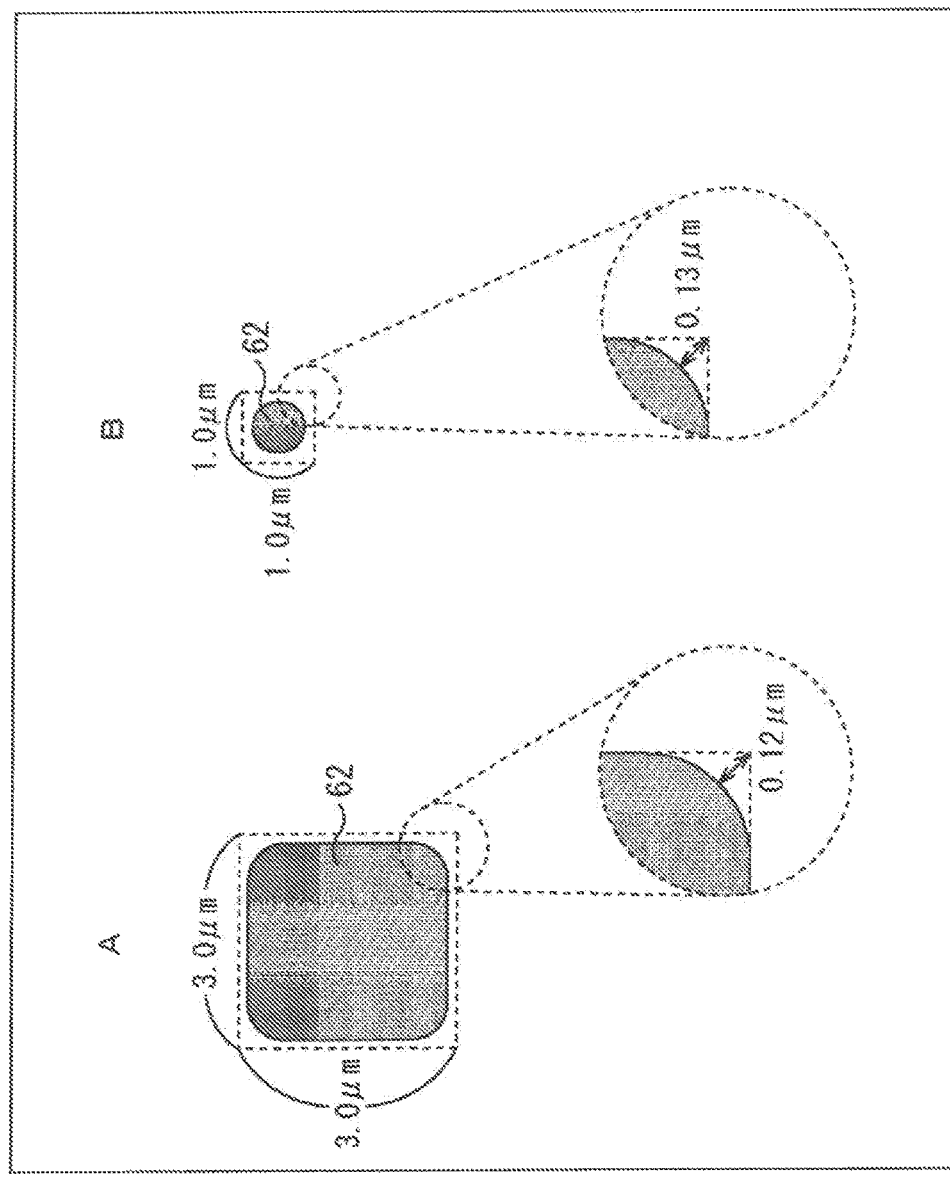
FIG. 13 A diagram for describing a dependency relationship between the pixel size and the curvature radius ratio.

A of FIG. 13 shows a plane view of the photoresist pattern 62 in the case where the pixel size is 3.0 μm. B of FIG. 13 shows a plane view of the photoresist pattern 62 in the case where the pixel size is 1.0 μm.

As described above, the photoresist pattern 62 formed by development is formed having rounded four corners. The degree of rounding is set to be substantially not changed as long as the size of the light-shielding portion of the photomask 61 shown in A of FIG. 11 (length of one side of light-shielding portion having square shape) is equal to or larger than 2.6 μm (the projection magnification is ¼, and hence the distance when the pattern exposure is actually performed is 0.65 μm. The pixel size is equivalent to 1.0 μm).

As shown in A of FIG. 13, in the case where the pixel size is 3.0 μm, a distance between a point of intersection of virtual extended lines of two sides of the photoresist pattern 62 and a rounded portion of the photoresist pattern 62 is set to 0.12 μm. On the other hand, as shown in B of FIG. 13, in the case where the pixel size is 1.0 μm, a distance between a point of intersection of virtual extended lines of two sides of the photoresist pattern 62 and a rounded portion of the photoresist pattern 62 is set to 0.13 μm.

That is, in the case where the pixel size is 3.0 μm, the width in the oblique direction (diagonal direction) with respect to the width of the photoresist pattern 62 in the horizontal direction (opposite-side direction) is a sufficiently large value. The photoresist pattern 62 is formed in a shape closer to the square in a planar view.

On the other hand, in the case where the pixel size is 1.0 μm, the photoresist pattern 62 is formed in a shape closer to the approximately circular shape in a planar view. In the case where the photoresist pattern 62 is formed in a shape closer to the approximately circular shape in a planar view, as in the example of FIG. 9, the photoresist patterns 62 are formed such that the curvature radiuses are substantially equal in the circumferential direction. By etching (transferring) such a photoresist pattern 62 to the microlens material formed in a base thereof, a microlens having a curvature radius ratio that is equal to or lower than 1.1 is formed.

As described above, in the case where the pixel size is equal to or smaller than 2.0 μm, a microlens having substantially the same curvature radius in the circumferential direction is formed as a result, and hence the curvature radius ratio is also equal to or lower than 1.1.

By the way, in recent years, the configuration in winch the imaging pixels and the phase difference detection pixels are provided in the same light-receiving region has been applied particularly to a solid-state imaging apparatus of an APS-C size or 35 mm full size and various considerations for improving the performance thereof have been taken. The pixel size in such a solid-state imaging apparatus is generally set to approximately 3 to 6 μm.

However, as described above, in the case where the pixel size is larger than 2.0 μm, the curvature radius ratio of the microlens is larger than 1.2. The present applicant manufactured a microlens (lens array) for an APS-C size solid-state imaging apparatus having a pixel size of 3.9 μm according to the above-mentioned method. As a result, a curvature radius ratio thereof was 1.34. In addition, the present applicant studied the AF performance of the solid-state imaging apparatus including those microlenses. As a result, good AF performance was not able to be obtained.

In view of this, in order to improve the AF performance of the solid-state imaging apparatus of the APS-C size or 35 mm full size, a method of forming a microlens by which the curvature radius ratio is kept low while suppressing an increase in the dry etching time even if the pixel size is 3 to 6 μm will be described hereinafter.

<Method 1 of Forming Microlens According to Present Technology>

Figure 14:
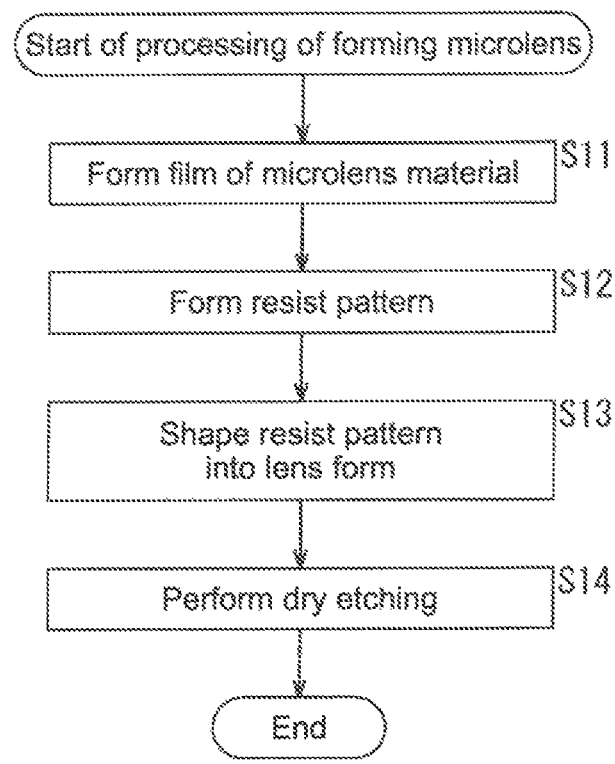
FIG. 14 A flowchart for describing an example of processing of forming a microlens.
Figure 15:
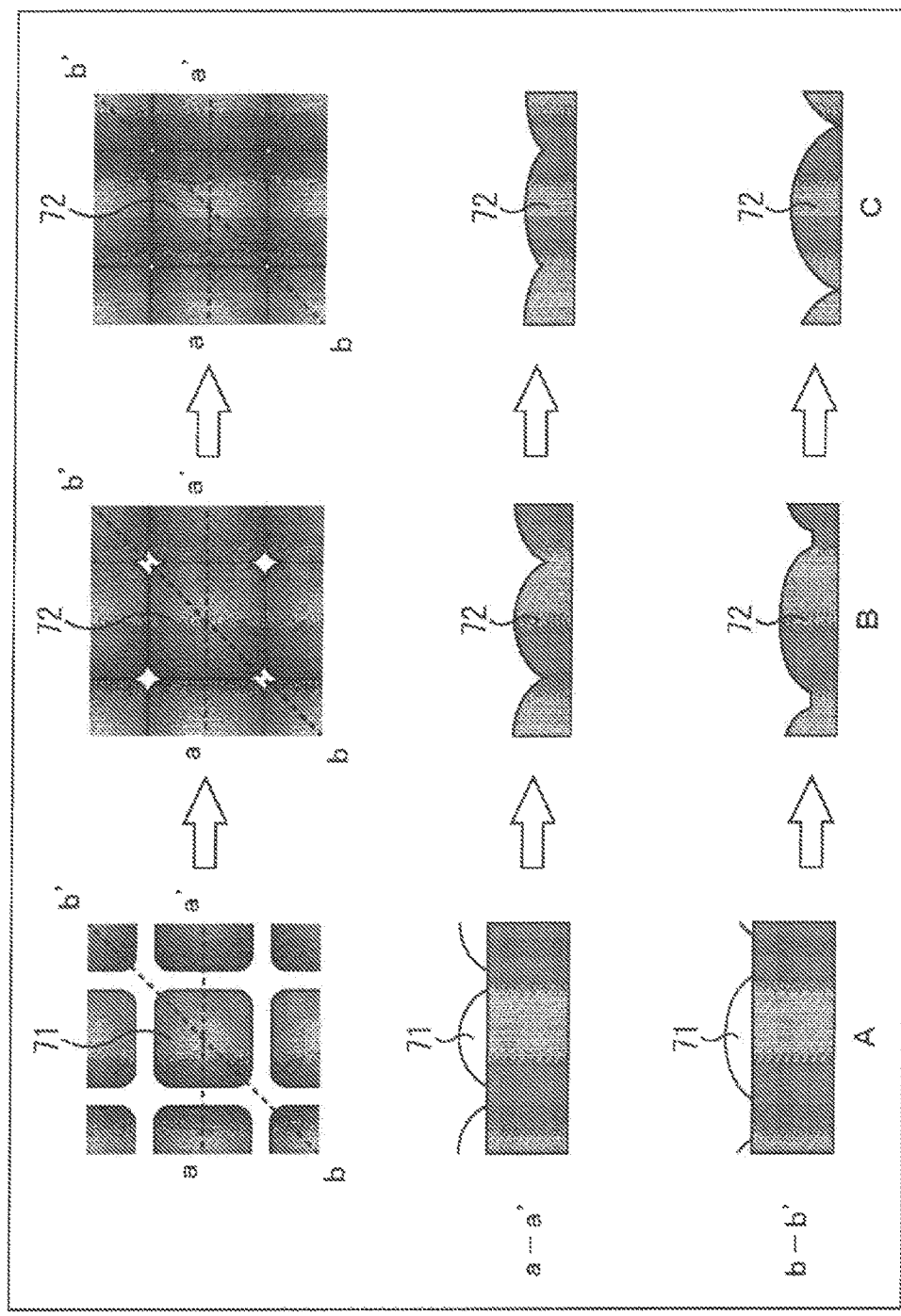
FIG. 15 A diagram for describing the steps of forming the microlens.

Referring to FIGS. 14 and 15, a method of forming a microlens according to present technology will be described. FIG. 14 is a flowchart for describing processing of forming a microlens. FIG. 15 is a plane view showing the steps of forming the microlens, a cross-sectional view in the horizontal direction, and a cross-sectional view in the oblique direction.

First, in Step S11, a film of a microlens material such as a styrene-based resin is formed on a planarization film.

In Step S12, a positive type photoresist pattern formed of a novolak resin or the like is formed on the microlens material by a photolithography method.

In Step S13, as shown in the process A of FIG. 15, a photoresist pattern 71 is formed in an upper convex lens shape by the heat treatment. At this time, the photoresist pattern 71 has a width in the oblique direction (b-b' direction) that is larger than a width in the horizontal direction (a-a' direction). Furthermore, a state in which the curvature radius of the cross-section in the diagonal direction is larger than the curvature radius of the cross-section in the opposite-side direction is obtained.

In Step S14, by etching (transferring) the photoresist pattern 71 to the microlens material formed in a base thereof, the dry etching is performed.

Here, an etching apparatus and etching gas that are used at this time will be described.

Regarding Etching Apparatus)

As the etching apparatus, other than a microwave plasma type etching apparatus, other high-density plasma type etching apparatuses such as a parallel plate RIE (Reactive Ion Etching) apparatus, a high-pressure narrow-gap type plasma etching apparatus, an ECR (Electron Cyclotron Resonance) type etching apparatus, a transformer coupled plasma type etching apparatus, an inductively coupled plasma type etching apparatus, and a helicon wave plasma type etching apparatus are used.

(Regarding Etching Gas)

As the etching gas, at least two types of gas of first-group gas for controlling an etching rate and second-group gas for controlling a CD (Critical Dimension) gain are used.

The first-group gas includes CF4, NF3, SF6, and the like and the second-group gas includes C3F8, C4F8, C4F6, C5F8, CF2F6, and the like.

Such fluorine-containing gas generates F-radicals and CF-radicals in plasma. In the dry etching process, the F-radicals act on etching in a depth direction with respect to the photoresist pattern and the microlens and the CF-radicals act on the expansion of the effective area of the microlens due to fluorocarbon-based deposits. That is, the first-group gas generates many F-radicals and the second-group gas generates many CF-radicals.

The ratio of the first-group gas to the second-group gas may be appropriately adjusted to obtain a desired curvature ratio of the microlens. Furthermore, other gas may be added.

In the process B of FIG. 15, in the dry etching process, etching in the depth direction with respect to the photoresist pattern 71 and a microlens 72 progresses while the effective area of the microlens is expanded. In the process B of FIG. 15, a state in which the microlenses 72 corresponding to the adjacent pixels in the horizontal direction (a-a' direction) are held in contact with each other is obtained. At this time, the microlens 72 is in a state in which the curvature radius of the cross-section in the diagonal direction is slightly larger than the curvature radius of the cross-section in the opposite-side direction.

By continuously performing dry etching from the state of the process B of FIG. 15, in the process C of FIG. 15, a state in which the microlenses 72 corresponding to the adjacent pixels in the oblique direction (b-b' direction) are held in contact with each other is obtained. At this time, the microlens 72 is in a state in which substantially no gap is formed between the microlenses 72 corresponding to the adjacent pixels in a planar view. Furthermore, at this time, in the microlens 72, the curvature radius of the cross-section in the horizontal direction (opposite-side direction) is closer to the curvature radius of the cross-section in the oblique direction (diagonal direction).

According to the above-mentioned processing, the effective area of the microlens is expanded and the curvature radius of the cross-section in the opposite-side direction is closer to the curvature radius of the cross-section in the diagonal direction. That is, the curvature radius ratio is closer to 1.0, which contributes to improvement of the AF performance. The present applicant manufactured a microlens (lens array) for an APS-C size solid-state imaging apparatus having a pixel size of 3.9 µm according to the above-mentioned method of the present technology. As a result, a curvature radius ratio thereof was 1.20 and good AF performance was able to be obtained. Thus, according to the method of the present technology, it becomes possible to form the microlens that can improve the AF performance while suppressing the deterioration of image quality.

Note that, when the present applicant evaluated the AF performance in the case where the curvature radius ratio was changed between 1.20 to 1.34 by changing the etching conditions in the above-mentioned method of the present technology, good AF performance was not able to be obtained. Thus, it can be said that it is desirable that the curvature radius ratio be set to be equal to or lower than 1.20 for obtaining good AF performance.

<Method 2 of Forming Microlens According to Present Technology>

Figure 16:
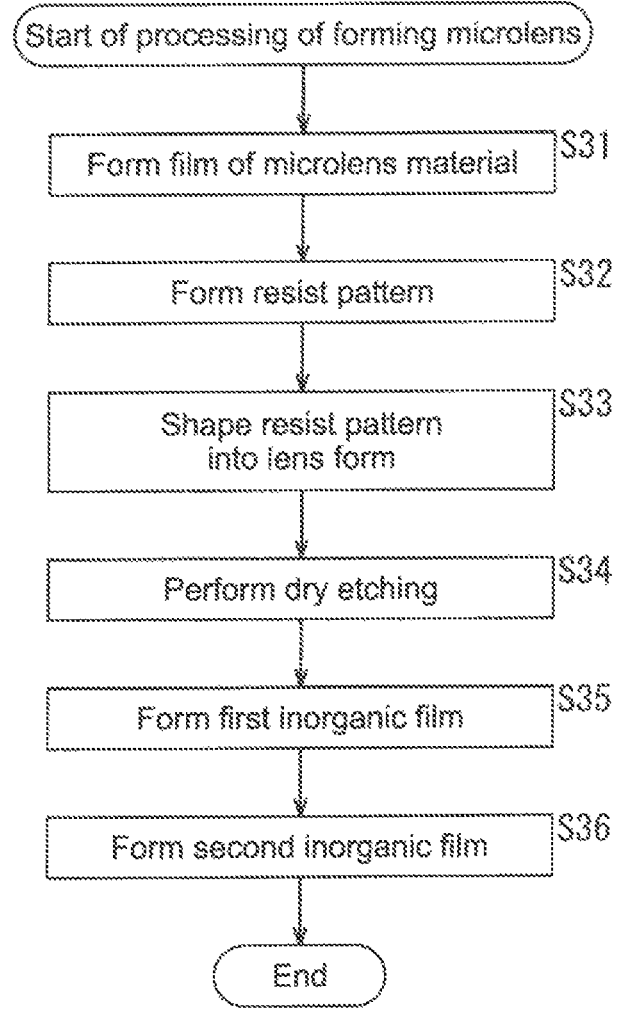
FIG. 16 A flowchart for describing another example of the processing of forming a microlens.
Figure 17:
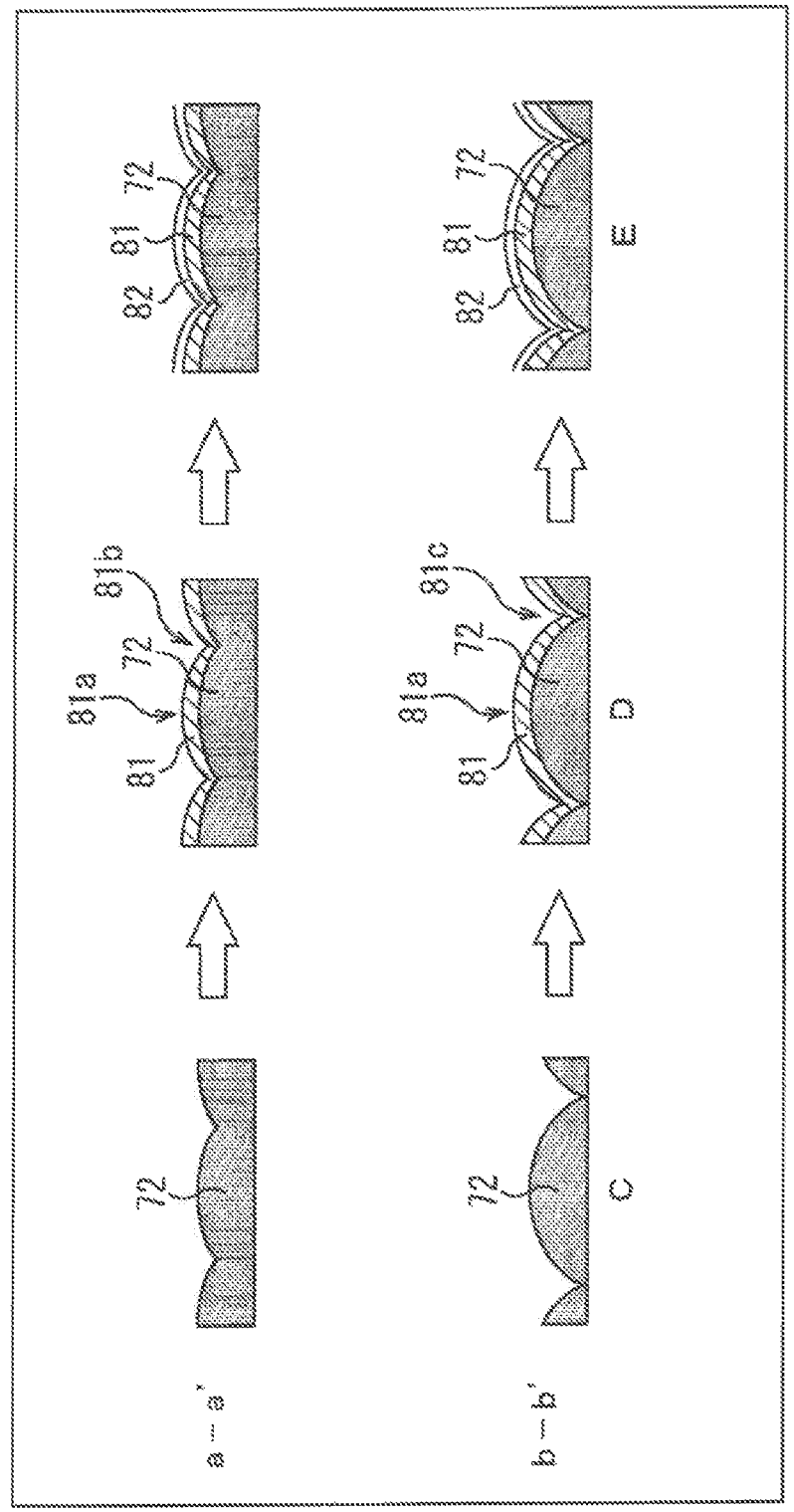
FIG. 17 A diagram for describing the steps of forming the microlens.

Next, referring to FIGS. 16 and 17, another example of the method of forming a microlens according to the present technology will be described. FIG. 16 is a flowchart for describing processing of forming a microlens. FIG. 17 is a cross-sectional view in the horizontal direction and a cross-sectional view in the oblique direction that shows the steps of forming the microlens.

Note that processes of Steps S31 to S34 of the flowchart of FIG. 16 are the same as the processes of Steps S11 to S14 of the flowchart of FIG. 14, and hence a description thereof will be omitted.

That is, after the microlens 72 is formed by the dry etching in Step S34 as shown in the process C of FIG. 17, a first inorganic film 81 is formed on the microlens 72 in Step S35 as shown in the process D of FIG. 17.

The first inorganic film 81 is formed by depositing SiON or the like at the temperature of approximately 1.60 to 200° C. by, for example, a dry film-forming method such as plasma CVD (Chemical Vapor Deposition). At this time, the film-forming conditions are adjusted such that the refractive index of SiON becomes substantially equal to the refractive index of approximately 1.57 to 1.61 of the microlens material that is a polystyrene-based resin.

According to the above-mentioned dry film-forming method, due to differences in the mean free path of film-forming molecules, the film-forming speed of the first inorganic film 81 is higher near a top portion 81a of the microlens 72 having a longer mean free path and lower near groove portions 81b and 81c of the microlens 72 having a shorter mean free path. In particular, the film-forming speed is lowest near the groove portion 81c of the microlens 72. Therefore, in the microlens 72, the difference between the curvature radius of the cross-section in the horizontal direction (a-a' direction) and the curvature radius of the cross-section in the oblique direction (b-b' direction) becomes small. As a result, the curvature radius ratio is improved from 1.20 after dry etching to 1.15.

In addition, after the first inorganic film 81 is formed, a second inorganic film 82 is formed on the first inorganic film 81 in Step S36 as shown in the process E of FIG. 17.

The second inorganic film 82 is formed by depositing SiO, SiOC, SiOF, SiOCH, or the like having a lower refractive index than that of SiON at the temperature of approximately 160 to 200° C. At this time, the second inorganic film 82 acts as an antireflection film for the microlens 72 by being formed with a film thickness that is ¼ of the wavelength of the visible light. Note that magnitude relationships between the microlens 72, the first inorganic film 81, and the second inorganic film 82 in this case are as follows.

(microlens 72)≈(first inorganic film 81)>(second inorganic film 82)

According to the above-mentioned processing, as in the processing described above with reference to the flowchart of FIG. 14, it becomes possible to form the microlens that can improve the AF performance while suppressing the deterioration of image quality. In addition, the second inorganic film 82 acts as the antireflection film for the microlens 72, and hence the reflectance on the microlens 72 is lowered and an improvement of the sensitivity characteristics of the solid-state imaging apparatus and a reduction in flare can be achieved. Thus, it becomes possible to further improve the image quality.

Note that, in the above-mentioned processing, the first inorganic film 81 may be formed by depositing SiON, SiN, or the like having a higher refractive index than that of the microlens 72 at the temperature of approximately 160 to 200° C. and the second inorganic film 81 may be formed by deposing SiO, SiOC, SiOF, SiOCH, or the like having a lower refractive index than that of the microlens 72 and the first inorganic film 81 at the temperature of approximately 160 to 200° C. At this time, the first inorganic film 81 and the second inorganic film 82 are acted as a two-layer antireflection film. With this, it is possible to further lower the reflectance on the microlens 72.

Note that magnitude relationships between the microlens 72, the first inorganic film 81, and the second inorganic film 82 in this case are as follows.

(first inorganic film 81)>(microlens 72)>(second inorganic film 82)

The present applicant studied the relationship of the curvature radius ratio to the pixel size in the case where the microlens 72 is formed according to two examples of the above-mentioned method of the present technology. The result is shown in FIG. 18.

Figure 18:
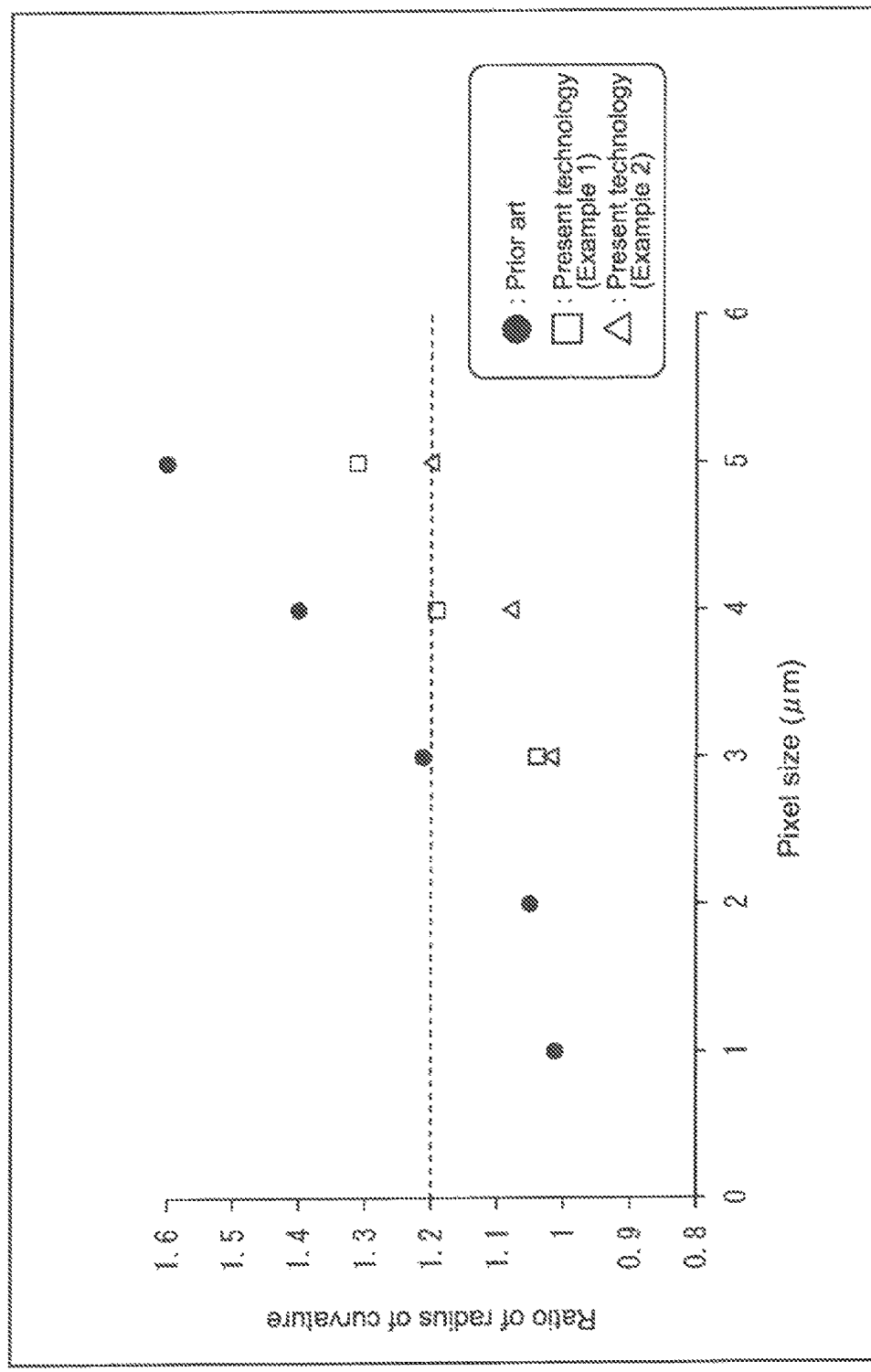
FIG. 18 A diagram for describing the curvature radius ratio with respect to the pixel size.

As shown in FIG. 18, in the conventional technique (black circular plots), when the pixel size is larger than 3.0 μm, the curvature radius ratio is higher than 1.2 that is a desirable value. On the other hand, in the example (Example 1) (white square plots) of the present technology described above with reference to FIGS. 14 and 15, even when the pixel size is 4.0 μm, the curvature radius ratio is a value that is equal to or lower than 1.2 that is the desirable value. In addition, in the example (Example 2) (white triangular plots) of the present technology described above with reference to FIGS. 16 and 17, even when the pixel size is 5.0 μm the curvature radius ratio is a value that is equal to or lower than 1.2 that is the desirable value. As described above, according to the present technology, the curvature radius ratio can be kept low even when the pixel size is 3 to 5 μm. Thus, it becomes possible to achieve an improvement, of the AF performance of the solid-state imaging apparatus of, in particular, the APS-C size, 35 mm full size, or the like that includes microlenses that are formed corresponding to phase difference detection pixels that are provided to be mixed in imaging pixels.

Note that the type of the film formed by the above-mentioned dry film-forming method is not limited to SiON, SiN, SiO, SiOC, and the like and ZnO, ZrO, Al2O3, TiO2, CaF2, LiF, MgO, or the like can also be used and a refractive index thereof is appropriately and suitably adjusted.

Although the plasma CVD is used as the dry film-forming method in the above, other CVD methods such, as thermal CVD, organic metal CVD, and optical CVD may be used. Furthermore, a PVD (Physical Vapor Deposition) method such as vacuum vapor deposition, ion plating, sputtering, laser ablation, and molecular beam epitaxy can also be used as other film-forming methods.

<Application to Solid-State Imaging Apparatus>

The solid-state imaging apparatus to which the present technology is applicable is roughly classified into a front side illumination type solid-state imaging apparatus and a back side illumination type solid-state imaging apparatus.

Figure 19:
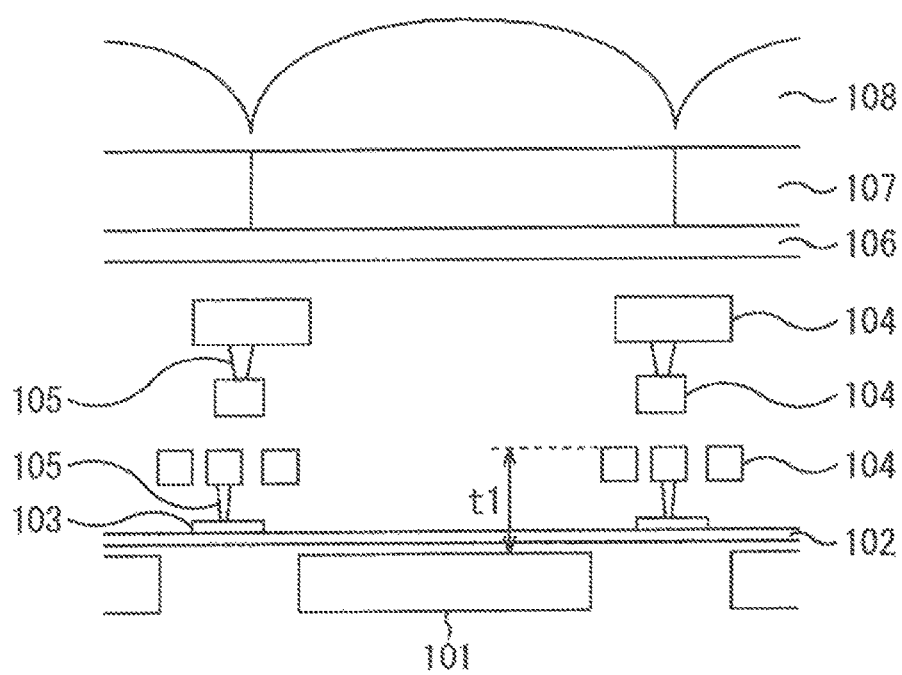
FIG. 19 A cross-sectional view showing a configuration example of a front side illumination type solid-state imaging apparatus.

FIG. 19 is a cross-sectional view showing a structure example of the front side illumination type solid-state imaging apparatus.

As shown in FIG. 19, in the front side illumination type solid-state imaging apparatus, a gate electrode 103 that is a pixel transistor is formed on an insulation film 102 formed above a photodiode 101. For example, three wiring layers 104 are formed above it. The gate electrode 103 and the wiring layers 104, and the wiring layers 104 are electrically connected via contacts 105.

A planarization film 106 is formed above the wiring layers 104. A color filter 107 is formed on the planarization film 106. Then, a microlens 108 is formed on the color filter 107.

In the case where phase difference detection pixels are provided in the front side illumination type solid-state imaging apparatus of FIG. 19, the first (lowermost) wiring layer 104 is formed as a light-shielding film for pupil division in the phase difference detection pixel. Thus, in the example of FIG. 19, a distance t1 between the light-shielding film and a top surface of the photodiode 101 in the phase difference detection pixel is a thickness including the contact 105.

Figure 20:
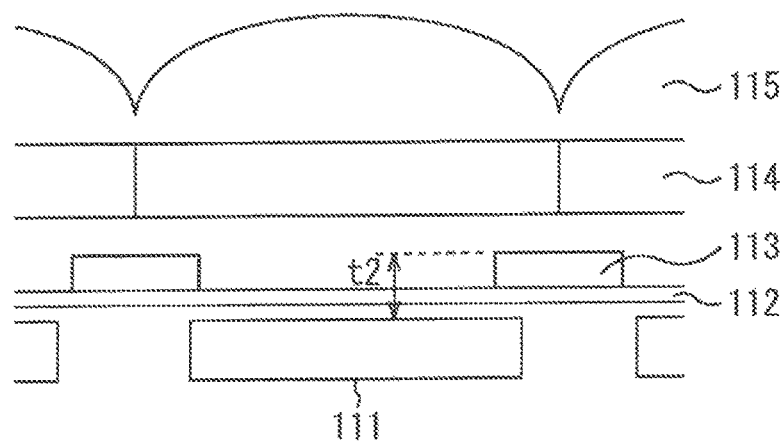
FIG. 20 A cross-sectional view showing a configuration example of a back side illumination type solid-state imaging apparatus.

FIG. 20 is a cross-sectional view showing a structure example of the back side illumination type solid-state imaging apparatus.

As shown in FIG. 20, in the back side illumination type solid-state imaging apparatus, a light-shielding film 113 is, for each pixel, formed on an insulation film 112 formed above a photodiode 111. A color filter 114 is formed above it. Then, a microlens 115 is formed on the color filter 114.

Note that, in the back side illumination type solid-state imaging apparatus, pixel transistors and wiring layers (not shown) are formed in a surface opposite to the surface on which the microlens 115 is formed.

In the case where the phase difference detection pixels are provided in the back side illumination type solid-state imaging apparatus of FIG. 20, the light-shielding film 113 provided in each pixel is formed as a light-shielding film for pupil division in the phase difference, detection pixel. Thus, in the example of FIG. 20, a distance t2 between the light-shielding film in the phase difference detection pixel and a top surface of the photodiode 111 can be made shorter than the distance t1 of FIG. 19.

By the way, the microlens of the present technology is also applicable to the microlens corresponding to the imaging pixel in the above-mentioned front side illumination type solid-state imaging apparatus or back side illumination type solid-state imaging apparatus. With this, in the solid-state imaging apparatus including the pixel array in which the imaging pixels and the phase difference detection pixels are mixed, it is possible to form the microlenses lens arrays) having the same shape at the same time without dividing the manufacturing process into those for the microlenses corresponding to the imaging pixels and for the microlenses corresponding to the phase difference detection pixels. Thus, it Is possible to avoid an increase of the number of steps.

Note that it is preferable that the focal position of the microlens corresponding to the phase difference detection pixel is set to be in the light-shielding film in view of the improvement of the AF performance. Furthermore, it is preferable that the focal position of the microlens corresponding to the imaging pixel is set to be in the photodiode surface in view of the improvement of the sensitivity characteristics.

Here, comparing the front side illumination type solid-state imaging apparatus of FIG. 19 with the back side illumination type solid-state imaging apparatus of FIG. 20, the distance between the light-shielding film and the photodiode surface is shorter in the back side illumination type solid-state imaging apparatus. Therefore, in the case where the microlenses having the same shape are formed at the same time for the imaging pixels and the phase difference detection pixels, it is possible to suppress the deterioration of the performance of those pixels in comparison with the front side illumination type solid-state imaging apparatus.

However, also in the front side illumination type solid-state imaging apparatus, in the case where the microlenses having the same shape for the imaging pixels and the phase difference detection pixels are formed by using the present technology, the performance of those pixels becomes better in comparison with the conventional technology.

By the way, in the case where the microlenses having the same shape for the imaging pixels and the phase difference detection pixels are formed, an inter-layer lens may be provided as a configuration for correcting the offset of the focal position of the microlens corresponding to those pixels.

Here, structure examples of the lower convex intra-layer lens and the upper convex intra-layer lens will be described. Here, a case where they are applied to the back side illumination type solid-state imaging apparatus will be described as an example.

<Lower Convex Intra-Layer Lens>

Figure 21:
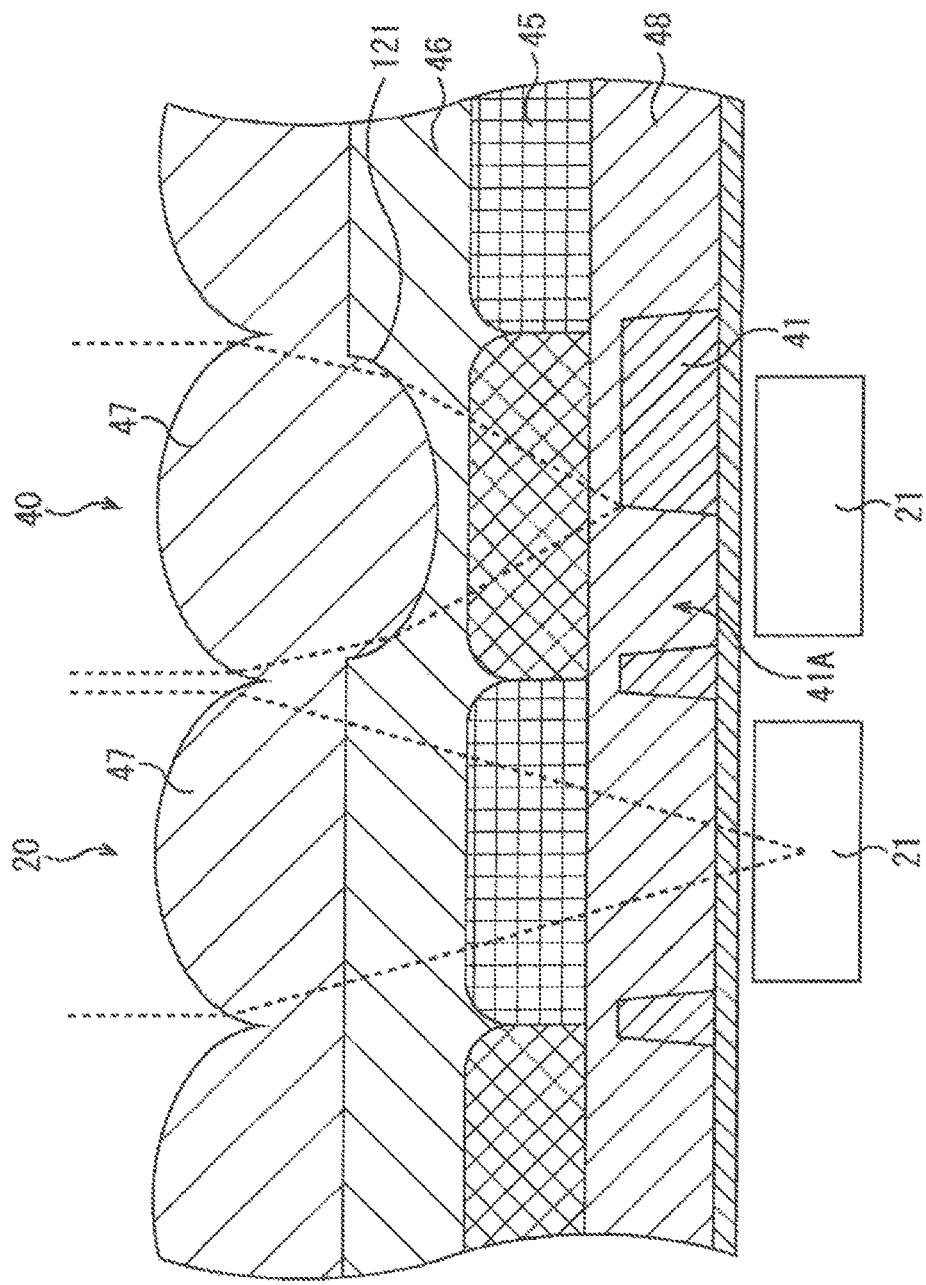
FIG. 21 A cross-sectional view showing a configuration example of a phase difference detection pixel including a lower convex intra-layer lens.

FIG. 21 is a cross-sectional view showing a pixel structure including a lower convex intra-layer lens formed on a color filter. Here, a cross-section structure corresponding to two pixels of an imaging pixel 20 and a phase difference detection pixel 40 that are adjacent to each other is shown.

As shown in FIG. 21, only for the phase difference detection pixel 40, a light-shielding film 41 including an opening 41A through which one of pupil-divided light beams passes is formed. In addition, a lower convex intra-layer lens 121 is formed in a planarization film 46 on a color filter 45. Note that the light-shielding film 41 also serves as a light-shielding film that is formed corresponding to a unit pixel to shield light between the pixels. The rough light-shielding film 41 is planarized by a planarization film 48.

The color filter 45 corresponding to the imaging pixel 20 is formed as a color filter for each of red, green, and blue colors. On the other hand, the color filter 45 corresponding to the phase difference detection pixel 40 is formed as a green or cyan color filter, a film through which visible light passes, or a layer formed of a black pigment such as carbon black and titanium black. Note that, without providing the color filter 45 corresponding to the phase difference detection pixel 40, the planarization film 46 may be buried after the color filter 45 corresponding to the imaging pixel 20 is formed.

The planarization film 46 is formed of an acrylic resin having a refractive index of about 1.5, a siloxane-based resin having a refractive index of approximately 1.45 to 1.5, a resin whose refractive index is adjusted to approximately 1.4 to 1.44 by adding fluorine to one of those resins, a resin whose refractive index is adjusted to approximately 1.2 to 1.39 by adding hollow silica particles to one of those resins, or the like.

A portion of the planarization film 46, in which the lower convex intra-layer lens 121 is to be formed, is subjected to photolithography and dry etching to have a shape corresponding to the lower convex intra-layer lens 121.

Figure 22:
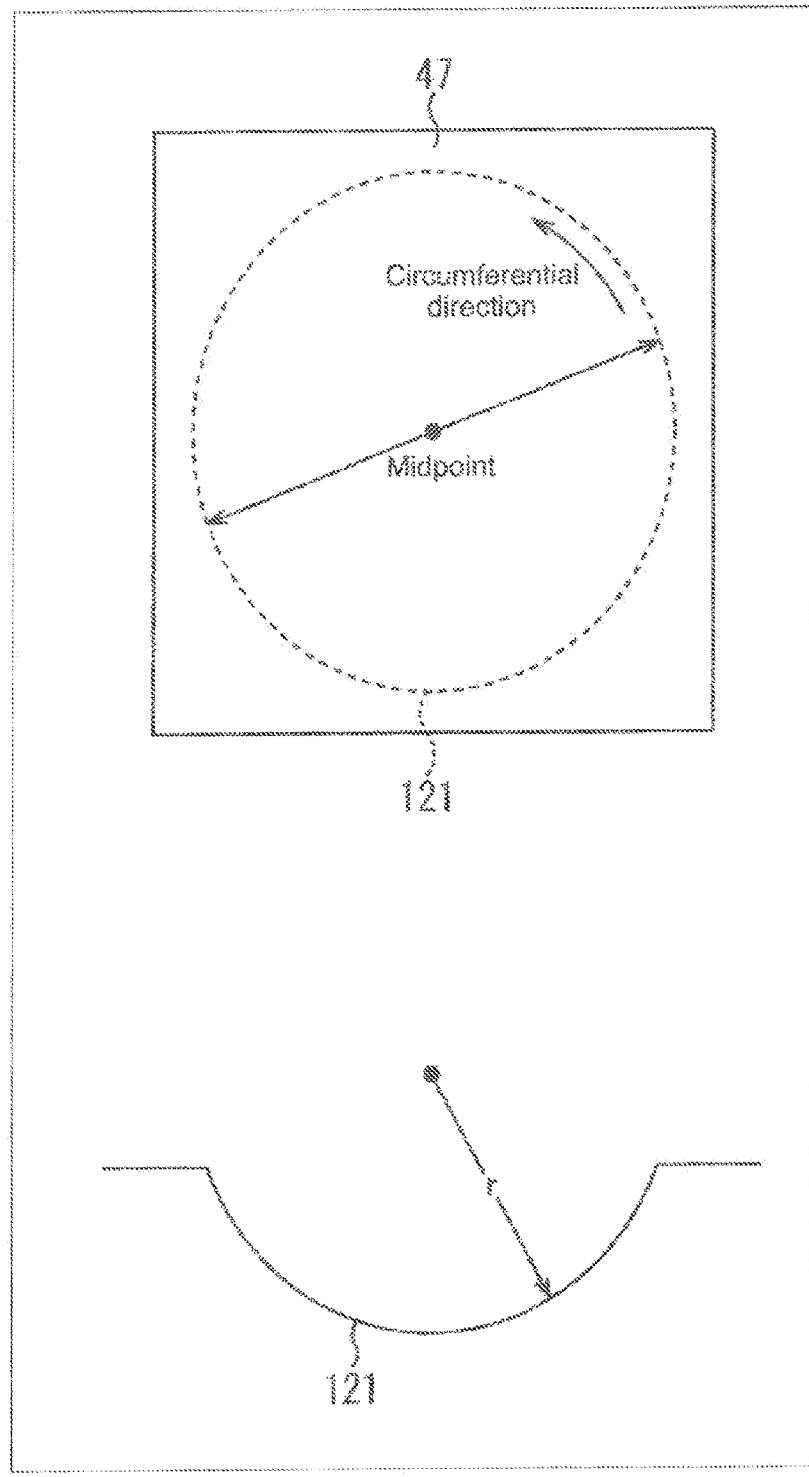
FIG. 22 A diagram for describing a circumferential position and a curvature radius of the lower-convex intra-layer lens.

The lower convex intra-layer lens 121 is formed such that, as shown in FIG. 22, favorably in a circular shape in a planar view, the curvature radius r of the cross-section in the circumferential direction is equal irrespective of the position in the circumferential direction with a midpoint in a planar view being a center.

At this time, it is favorable that the lower convex intra-layer lens 121 is formed of the same material as the microlenses 47 integrally with the microlens 47. The microlenses 47 for the imaging pixel and the phase difference detection pixel are formed having the same shape at the same time, using, for example, a styrene-based resin having a refractive index of approximately 1.57 to 1.61, a novolak resin of a refractive index of about 1.6, a polyimide-based resin of a refractive index of about 1.7, or a resin whose refractive index is adjusted to approximately 1.7 to 2.0 by adding, for example, metal oxide fine particles such as zinc oxide, zirconium, oxide, niobium oxide, titanium oxide, and tin oxide to the resin.

In the solid-state imaging apparatus of FIG. 21, the lower convex intra-layer lens 121 corrects the focal position of light collected by the microlens 47 toward the microlens 47 and the focal position becomes constant irrespective of the position in the circumferential direction in a planar view of the lower convex intra-layer lens 121. Therefore, irrespective of the distance between the light-shielding film and the photodiode, the AF performance of the solid-state imaging apparatus can be improved.

Although, in this example, the configuration in which the lower convex intra-layer lens 121 is formed in the planarization film 46 on the color filter 45 has been described as an example, a configuration in which the penalization film is formed below the color filter 45 and the lower convex intra-layer lens 121 is formed in the planarization film may be adopted.

<Upper Convex Intra-Layer Lens>

Figure 23:
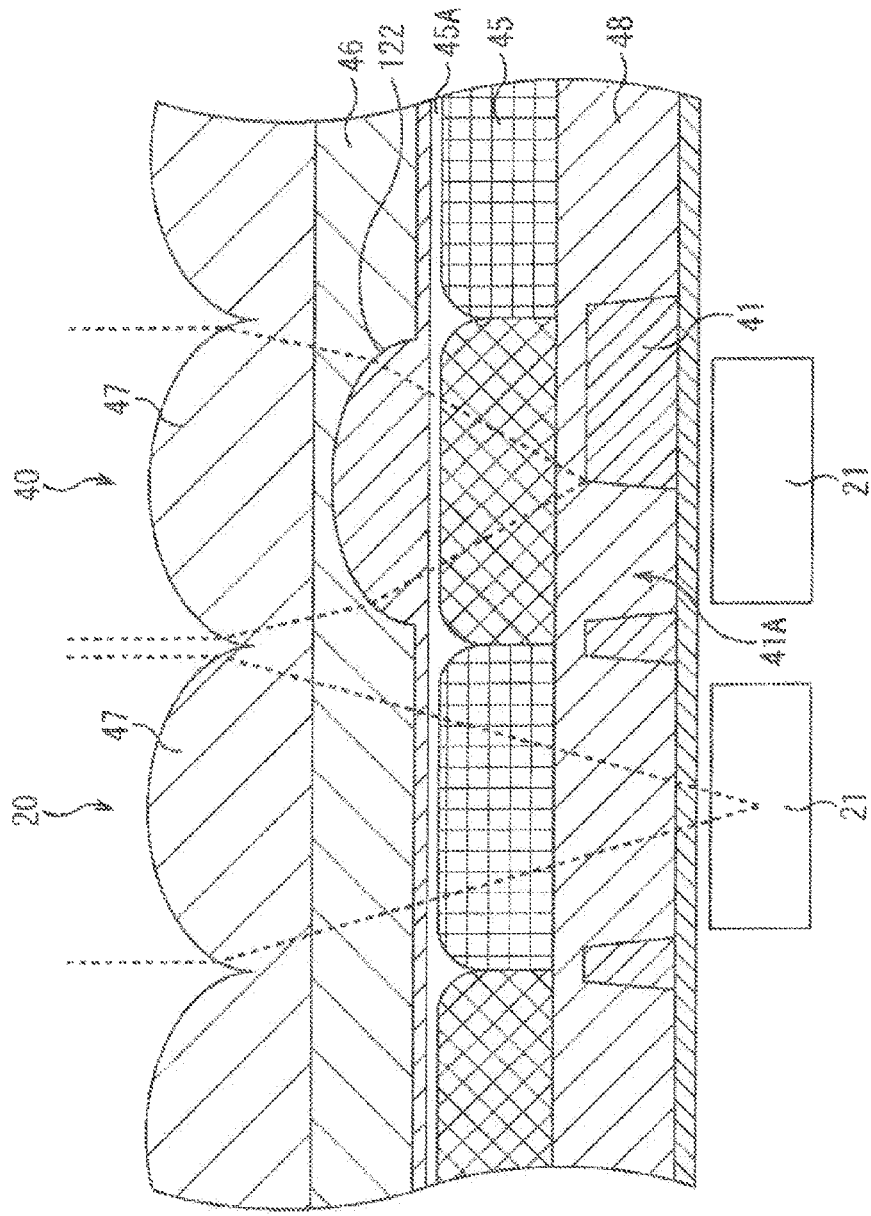
FIG. 23 A cross-sectional view showing a configuration example of a phase difference detection pixel including an upper convex intra-layer lens.

FIG. 23 is a cross-sectional view showing a pixel structure including an upper convex intra-layer lens that is formed on the color filter. Here, a cross-section structure corresponding to two pixels of the imaging pixel 20 and the phase difference detection pixel 40 that are adjacent to each other is shown.

As shown in FIG. 23, only for the phase difference detection pixel 40, the light-shielding film 41 including the opening 41A through which one of pupil-divided light beams passes is formed. In addition, an upper convex intra-layer lens 122 is formed in a planarization film 46 on a color filter 45. Note that the light-shielding film 41 also serves as a light-shielding film that is formed corresponding to a unit pixel to shield light between the pixels. The rough light-shielding film 41 is planarized by a planarization film 48.

The color filter 45 corresponding to the imaging pixel 20 is formed as a color filter for each of red, green, and blue colors. On the other hand, the color filter 45 corresponding to the phase difference detection pixel 40 is formed as a green or cyan color filter, a film through which visible light passes, or a layer formed of a black pigment such as carbon black and titanium black. Note that, without providing the color filter 45 corresponding to the phase difference detection pixel 40, a color filter cover film 45 A formed of an acrylic resin or the like may be buried after the color filter 45 corresponding to the imaging pixel 20 is formed.

Figure 24:
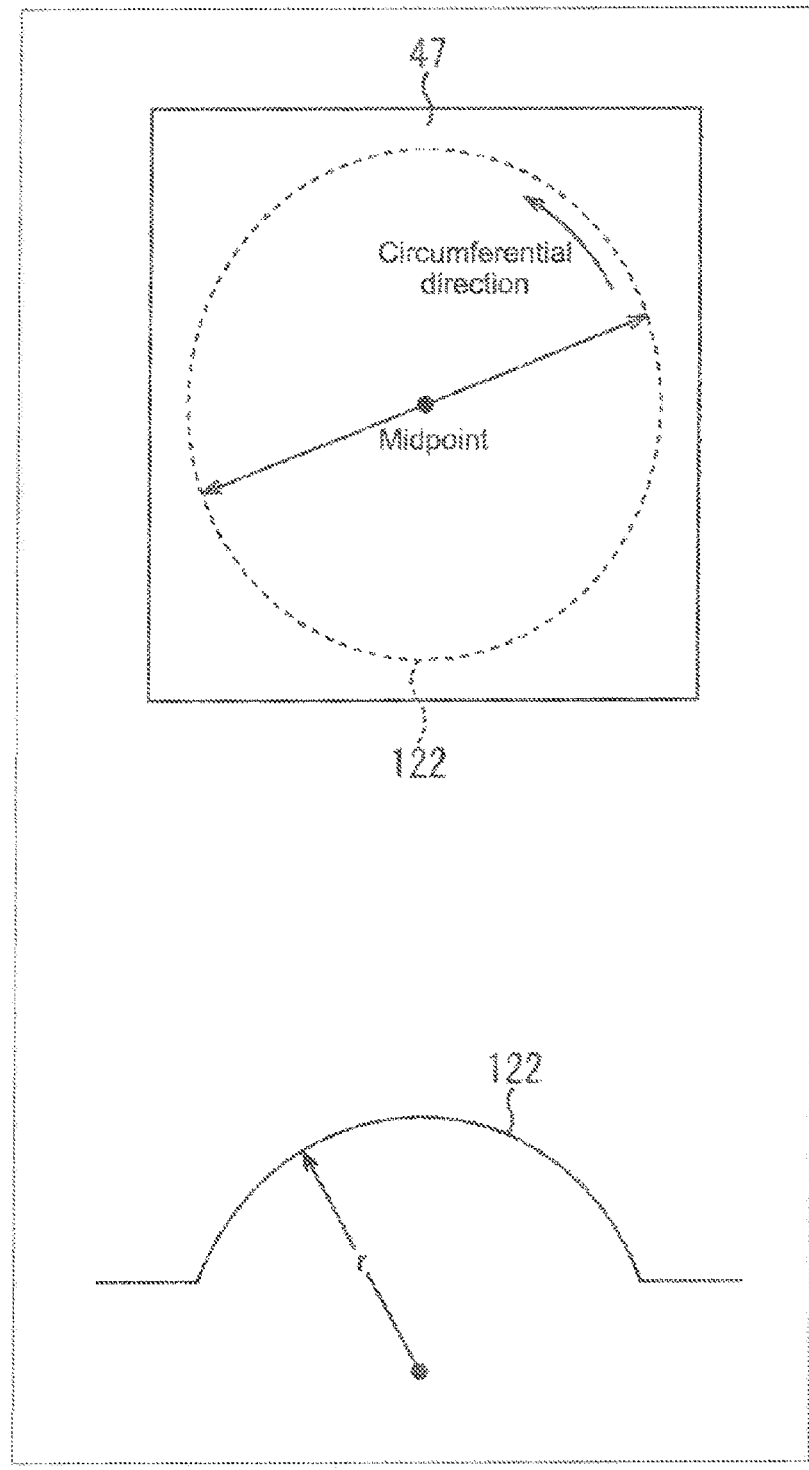
FIG. 24 A diagram for describing a circumferential position and a curvature radius of the upper convex intra-layer lens.

The upper convex intra-layer lens 122 is formed such that, as shown in FIG. 24, favorably in a circular shape in a planar view, the curvature radius r of the cross-section in the circumferential direction is equal irrespective of the position in the circumferential direction with a midpoint in a planar view being a center.

The upper convex intra-layer lens 121 is formed by performing photolithography and dry etching on, for example, a styrene-based resin having a refractive index of approximately 1.57 to 1.61, a novolak resin having a refractive index of about 1.6, a polyimide-based resin having a refractive index of about 1.7, or a material whose refractive index is adjusted to approximately 1.7 to 2.0 by adding, for example, metal oxide fine particles such as zinc oxide, zirconium oxide, niobium oxide, titanium oxide, and tin oxide to the resin, and SiON, SiN, or the like having a refractive index of approximately 1.6 to 1.9 whose film is formed according to the dry film-forming method.

The planarization film 46 is formed of an acrylic resin having a refractive index of about 1.5, a siloxane-based resin having a refractive index of approximately 1.45 to 1.5, a resin whose refractive index is adjusted to approximately 1.4 to 1.44 by adding fluorine to one of those resins, and a resin whose refractive index is adjusted to approximately 1.2 to 1.39 by adding hollow silica particles to one of those resins, or the like. Those refractive indexes are lower than the refractive index of the upper convex intra-layer lens 122.

The microlenses 47 for the imaging pixels and the phase difference detection pixels are formed having the same shape at the same time, using, for example, a styrene-based resin.

In the solid-state imaging apparatus of FIG. 23, the upper convex, intra-layer lens 122 corrects the focal position of light collected by the microlens 47 to be closer to the microlens 47 and the focal position becomes constant irrespective of the position in the circumferential direction in a planar view of the upper convex intra-layer lens 122. Therefore, irrespective of the distance between the light-shielding film and the photodiode, the AF performance of the solid-state imaging apparatus can be improved.

Although, in this example, the configuration in which the upper convex intra-layer lens 122 is formed in the planarization film 46 on the color filter 45 has been described as an example, a configuration in which the planarization film is formed below the color filter 45 and the upper convex intra-layer lens 122 is formed in the planarization film may be adopted.

The present technology Is not limited to application to the solid-state imaging apparatus. The present technology is applicable to electronic apparatuses each including a solid-state imaging apparatus, for example, an imaging apparatus such as a digital still camera and a video camera, a portable terminal apparatus having imaging functions such as a cellular phone, or the like.

<Application to Electronic Apparatus>

Figure 25:
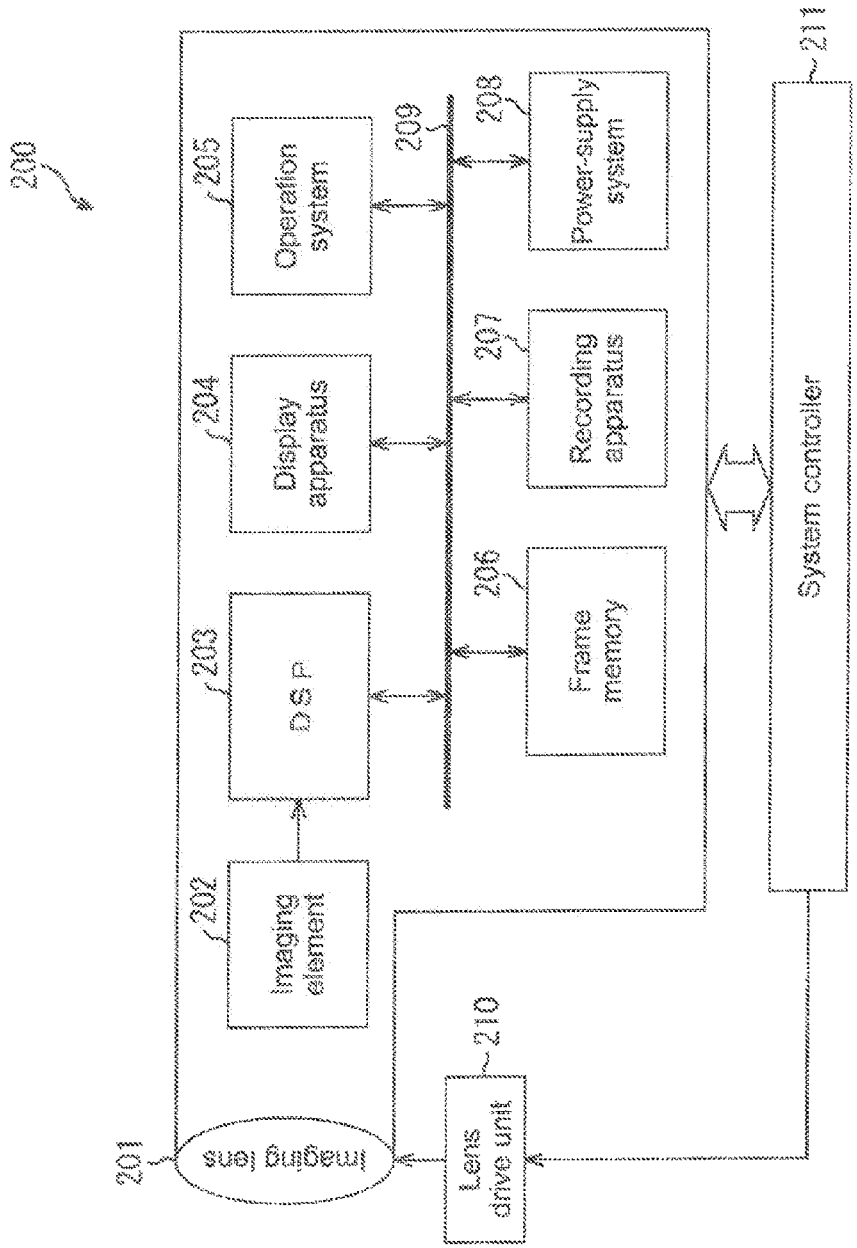
FIG. 25 A block diagram showing an embodiment of an electronic apparatus to which the present technology is applied.

FIG. 25 is a block diagram showing a configuration example of an imaging apparatus that is an example of the electronic apparatus to which the present technology is applied.

As shown in FIG. 25, an imaging apparatus 200 includes an optical system including an imaging lens 201 and the like, an imaging element 202, a DSP (Digital Signal Processor) circuit 203 that is a camera signal processing unit, a frame memory 204, a display apparatus 205, a recording apparatus 206, an operation system 207, a power-supply system 208, and the like. The DSP circuit 203, the frame memory 204, the display apparatus 205, the recording apparatus 206, the operation system 207, and the power-supply system 208 are connected to be communicable with one another via a bus line 209.

The imaging lens 201 captures incident light from a subject and forms an image thereof on an imaging surface of the imaging element 202. The imaging element 202 converts the light amount of the incident light, whose image is formed on the imaging surface by the imaging lens 201, into an electrical signal for each pixel and outputs it as a pixel signal. As this imaging element 202, the solid-state imaging apparatus of the present technology that includes pixels for phase difference detection can be used.

The display apparatus 205 is constituted of a panel type display apparatus such as a liquid-crystal display apparatus and an organic EL (Electro Luminescence) display apparatus. The display apparatus 205 displays a moving image or still image that is captured by the imaging element 202. The recording apparatus 206 records the moving image or still image captured by the imaging element 202 on a recording medium such as a memory card, a video tape, and a DVD (Digital Versatile Disk).

The operation system 207 issues operation commands relating to the various functions of the imaging apparatus 200 according to user's operations. The power-supply system 208 appropriately supplies various powers as operation power sources to the DSP circuit 203, the frame memory 204, the display apparatus 205, the recording apparatus 206, and the operation system 207 as those supply targets.

In addition, the imaging apparatus 200 includes a lens driving unit 210 that drives the imaging lens 201 in an optical axis direction thereof. The lens driving unit 210 and the imaging lens 201 constitute a focus mechanism for adjusting the focal point. A system controller 211 performs various controls such as controls on the focus mechanism, the above-mentioned components, and the like in the imaging apparatus 200.

Regarding the control on the focus mechanism, based on phase difference detection signals output from the pixels for phase difference detection in the solid-state imaging apparatus of the present technology, arithmetic processing for calculating the offset direction and the offset amount of the focal point in, for example, the DSP circuit 203 is performed. When receiving the arithmetic result, the system controller 211 performs focus control such that focus is achieved by moving the imaging lens 201 in the optical axis direction thereof via the lens driving unit 210.

Although the embodiments of the present technology are not limited to the above-mentioned embodiments and various modifications can be made without departing from the gist of the present technology.

It should be noted that the present technology may also take the following configurations.

(1)
A lens array, including
a microlens that is formed corresponding to a phase difference detection pixel that is provided to be mixed in an imaging pixel, the microlens being formed such that
a lens surface thereof is a substantially spherical surface,
the microlens has a rectangular shape in a planar view and four corners are not substantially rounded, and
a bottom surface in vicinity of an opposite-side boundary portion that includes an opposite-side center portion of a pixel boundary portion in a cross-sectional view is higher than a bottom surface in vicinity of a diagonal boundary portion that includes a diagonal boundary portion.

(2)
The lens array according to (1), in which
the microlens is formed such that
the microlens has a square shape in a planar view, and
a first curvature radius that is a curvature radius of the lens surface in a cross-section of the opposite-side center portion and a second curvature radius that is a curvature radius of the lens surface in a cross-section of the diagonal boundary portion are approximately equal.

(3)
The lens array according to (2), in which
a pixel size of the phase difference detection pixel is set to be equal to or larger than 3 μm, and
if the curvature radius r of the lens surface is expressed by $r=(d^2+4t^2)/8t$ where d denotes a width of a bottom surface in a cross-section extending through a top of the lens surface and t denotes a height of the top of the lens surface with the bottom surface being a reference, a curvature radius ratio r1/r2 that is a ratio between the first curvature radius r1 and the second curvature radius r2 is set to a value included in a range of from 0.98 to 1.20.

(4)

The lens array according to (2) or (3), in which
at least one inorganic film is formed as an antireflection film on a top surface of the lens surface.

(5)

The lens array according to (4), in which
the inorganic film makes a difference between the first curvature radius r1 and the second curvature radius r2 smaller.

(6)

A manufacturing method for a lens array including a microlens that is formed corresponding to a phase difference detection pixel that is provided to be mixed in an imaging pixel, the method including the step of:
   forming the microlens such that
      a lens surface thereof is a substantially spherical surface,
      the microlens has a rectangular shape in a planar view and four corners are not substantially rounded, and
      a bottom surface in vicinity of an opposite-side boundary portion that includes an opposite-side center portion, of a pixel boundary portion in a cross-sectional view is higher than a bottom surface in vicinity of a diagonal boundary portion that includes a diagonal boundary portion.

(7)

A solid-state imaging apparatus, including
a lens array including microlenses each being formed corresponding to a phase difference detection pixel that is provided to be mixed in an imaging pixel, the microlens being formed such that
   a lens surface thereof is a substantially spherical surface,
   the microlens has a rectangular shape in a planar view and four corners are not substantially rounded, and
   a bottom surface in vicinity of an opposite-side boundary portion that includes an opposite-side center portion of a pixel boundary portion in a cross-sectional view is higher than a bottom surface in vicinity of a diagonal boundary portion that includes a diagonal boundary portion.

(8)

An electronic apparatus, including
a solid-state imaging apparatus including
a lens array including microlenses each being formed corresponding to a phase difference detection pixel that is provided to be mixed in an imaging pixel, the microlens being formed such that
   a lens surface thereof is a substantially spherical surface,
   the microlens has a rectangular shape in a planar view and four corners are not substantially rounded, and
   a bottom surface in vicinity of an opposite-side boundary portion that includes an opposite-side center portion of a pixel boundary portion in a cross-sectional view is higher than a bottom surface in vicinity of a diagonal boundary portion that includes a diagonal boundary portion.

DESCRIPTION OF REFERENCE NUMERALS

10 CMOS image sensor
12 pixel array section
20 imaging pixel
40 phase difference detection pixel
41 light-shielding film
47 microlens
200 imaging apparatus
202 imaging element

The invention claimed is:

1. A lens array, comprising:
a microlens that corresponds to a phase difference detection pixel, wherein the phase difference detection pixel is mixed with an imaging pixel,
wherein the microlens comprises:
   a lens surface that is a substantially spherical surface, the microlens has a square shape in a planar view and four corners of the microlens are not substantially rounded,
   a first bottom surface in vicinity of an opposite-side boundary portion that includes an opposite-side center portion of a pixel boundary portion, and a second bottom surface in vicinity of a diagonal boundary portion that includes a diagonal boundary portion,
   wherein the first bottom surface in a cross-sectional view is higher than the second bottom surface,
   the lens surface has a first curvature radius r1 and a second curvature radius r2, the first curvature radius r1 is a curvature radius in a cross-section of the opposite-side center portion and the second curvature radius r2 is a curvature radius of the lens surface in a cross-section of the diagonal boundary portion,
   the curvature radius of the lens surface is $r=(d^2+4t^2)/8t$, where d denotes a width of a third bottom surface of the microlens in a cross-section that extends through a top of the lens surface and t denotes a height of the top of the lens surface with the third bottom surface as a reference, and
   wherein a curvature radius ratio r1/r2 between the first curvature radius r1 and the second curvature radius r2 is a value in a range of 0.98 to 1.20.

2. The lens array according to claim 1, further comprising at least one inorganic film is on a top surface of the lens surface, and wherein the at least one inorganic film is an antireflection film.

3. The lens array according to claim 2, wherein a difference between the first curvature radius r1 and the second curvature radius r2 is based on the at least one inorganic film.

4. A manufacturing method for a lens array, the method comprising:
   forming a microlens that corresponds to a phase difference detection pixel, wherein the phase difference detection pixel is mixed with an imaging pixel,
   wherein the microlens is formed such that:
      a lens surface of the microlens is a substantially spherical surface, the microlens has a square shape in a planar view and four corners of the microlens are not substantially rounded,
      a first bottom surface of the microlens is in vicinity of an opposite-side boundary portion that includes an opposite-side center portion of a pixel boundary portion,
      a second bottom surface of the microlens is in vicinity of a diagonal boundary portion that includes a diagonal boundary portion,
      the first bottom surface in a cross-sectional view is higher than the second bottom surface,
      the lens surface has a first curvature radius r1 and a second curvature radius r2, the first curvature radius r1 is a curvature radius in a cross-section of the opposite-side center portion and the second curvature radius r2 is a curvature radius of the lens surface in a cross-section of the diagonal boundary portion, the curvature radius of the lens surface is $r=(d^2+4t^2)/8t$, where d denotes a width of a third bottom surface of the microlens in a cross-section extending through a top of the lens surface and t denotes a height of the top of the lens surface with the third bottom surface as a reference, and a curvature radius ratio r1/r2 between the first curvature radius r1 and the second curvature radius r2 is a value in a range of 0.98 to 1.20.

5. A solid-state imaging apparatus, comprising:

a lens array that includes a plurality of microlenses, each microlens of the plurality of microlenses corresponds to a phase difference detection pixel, wherein the phase difference detection pixel is mixed with an imaging pixel, wherein a microlens of the plurality of microlenses comprises:
- a lens surface that is a substantially spherical surface, the microlens has a square shape in a planar view and four corners of the microlens are not substantially rounded,
- a first bottom surface in vicinity of an opposite-side boundary portion that includes an opposite-side center portion of a pixel boundary portion, and
- a second bottom surface in vicinity of a diagonal boundary portion that includes a diagonal boundary portion, wherein the first bottom surface in a cross-sectional view is higher than the second bottom surface, the lens surface has a first curvature radius r1 and a second curvature radius r2, the first curvature radius r1 is a curvature radius in a cross-section of the opposite-side center portion and the second curvature radius r2 is a curvature radius of the lens surface in a cross-section of the diagonal boundary portion, the curvature radius of the lens surface is $r=(d^2+4t^2)/8t$, where d denotes a width of a third bottom surface of the microlens in a cross-section that extends through a top of the lens surface and t denotes a height of the top of the lens surface with the third bottom surface as a reference, and wherein a curvature radius ratio r1/r2 between the first curvature radius r1 and the second curvature radius r2 is a value in a range of 0.98 to 1.20.

6. An electronic apparatus, comprising:

a solid-state imaging apparatus that includes:
  a lens array, wherein the lens array includes a plurality of microlenses, and each microlens of the plurality of microlenses corresponds to a phase difference detection pixel, and wherein the phase difference detection pixel is mixed with an imaging pixel, wherein a microlens of the plurality of microlenses comprises:
- a lens surface that is a substantially spherical surface, the microlens has a square shape in a planar view and four corners of the microlens are not substantially rounded,
- a first bottom surface in vicinity of an opposite-side boundary portion that includes an opposite-side center portion of a pixel boundary portion, and
- a second bottom surface in vicinity of a diagonal boundary portion that includes a diagonal boundary portion, wherein the first bottom surface in a cross-sectional view is higher than the second bottom surface, the lens surface has a first curvature radius r1 and a second curvature radius r2, the first curvature radius r1 is a curvature radius in a cross-section of the opposite-side center portion and the second curvature radius r2 is a curvature radius of the lens surface in a cross-section of the diagonal boundary portion, the curvature radius of the lens surface is $r=(d^2+4t^2)/8t$, where d denotes a width of a third bottom surface of the microlens in a cross-section that extends through a top of the lens surface and t denotes a height of the top of the lens surface with the third bottom surface as a reference, and wherein a curvature radius ratio r1/r2 between the first curvature radius r1 and the second curvature radius r2 is in a range of 0.98 to 1.20.

* * * * *